United States Patent
Watanabe et al.

(10) Patent No.: US 7,352,195 B2
(45) Date of Patent: Apr. 1, 2008

(54) ELECTRON BEAM APPARATUS WITH DETAILED OBSERVATION FUNCTION AND SAMPLE INSPECTING AND OBSERVING METHOD USING ELECTRON BEAM APPARATUS

(75) Inventors: Kenji Watanabe, Kanagawa-ken (JP); Tohru Satake, Kanagawa-ken (JP); Nobuharu Noji, Kanagawa-ken (JP); Takeshi Murakami, Tokyo (JP); Tsutomu Karimata, Kanagawa-ken (JP); Yuichiro Yamazaki, Tokyo (JP); Ichirota Nagahama, Ibaraki-ken (JP); Atsushi Onishi, Kanagawa-ken (JP)

(73) Assignees: Ebara Corporation, Tokyo (JP); Kabushiki Kaisha Toshiba, Tokyo (JP)

(*) Notice: Subject to any disclaimer, the term of this patent is extended or adjusted under 35 U.S.C. 154(b) by 0 days.

(21) Appl. No.: 11/723,591

(22) Filed: Mar. 21, 2007

(65) Prior Publication Data

US 2007/0200569 A1   Aug. 30, 2007

Related U.S. Application Data

(62) Division of application No. 11/019,111, filed on Dec. 22, 2004, now Pat. No. 7,212,017.

(30) Foreign Application Priority Data

Dec. 25, 2003  (JP) ............................ 2003-429926

(51) Int. Cl.
*G01N 23/00* (2006.01)

(52) U.S. Cl. .................................... 324/751; 324/765
(58) Field of Classification Search ........ 324/750–765, 324/500–501; 250/310–311, 492.2, 492.3, 250/492

See application file for complete search history.

(56) References Cited

U.S. PATENT DOCUMENTS 5,089,774 A * 2/1992 Nakano ...................... 324/751

(Continued)

OTHER PUBLICATIONS

K. Tsuno, Elsevier Ultramicroscopy 55 (1994) pp. 127-140.

(Continued)

*Primary Examiner*—Vinh P. Nguyen
(74) *Attorney, Agent, or Firm*—Westerman, Hattori, Daniels & Adrian, LLP.

(57) ABSTRACT

Provided is a sample observing method allowing for a detailed observation of a sample by using one and the same electron beam apparatus. The method uses an electron beam apparatus 1 comprising a primary optical system 10 serving for irradiating the electron beam onto the sample surface and a secondary optical system 30 serving for detecting secondary electrons emanating from said sample surface to form an image of the sample surface. The inspection is carried out on the sample surface, S, by irradiating the electron beam to the sample surface, and after the extraction of a defective region in the sample based on the inspection, the extracted defective region is once again applied with the irradiation of the electron beam so as to provide a magnification or a detailed observation of the defective region.

7 Claims, 27 Drawing Sheets

U.S. PATENT DOCUMENTS

| | | | |
|---|---|---|---|
| 5,424,541 A * | 6/1995 | Todokoro et al. | 250/310 |
| 5,576,833 A | 11/1996 | Miyoshi | |
| 6,444,981 B1 | 9/2002 | Todokoro et al. | |
| 6,919,564 B2 | 7/2005 | Nara et al. | |
| 7,138,629 B2 * | 11/2006 | Noji et al. | 250/311 |
| 2003/0164460 A1 | 9/2003 | Shinada et al. | |

OTHER PUBLICATIONS

Motosuke Miyoshi et al., J. Vac. Sci. Technol. B 19 (6), American Vacuum Society, Nov./Dec. 2001, pp. 2852-2855.

Tech. Paper (LSI Manf.), Inspect./Analysis, The Advent of Defect Inspect. Tech. Makes Mass prod. Of 90nm Possible, Apr. 2003 Nikkei Micodevices (7-shts) (In English).

Tech. Paper (LSI Manf.), Inspect./Analysis, The Advent of Defect Inspect. Tech. Makes Mass prod. Of 90nm Possible, Apr. 2003 Nikkei Micodevices (7-shts) (In Japanese).

Rose, H. et al., Outline of a Versatile Corrected LEEM, Optik, 1992, pp. 31-44, vol. 92, No. 1.

Ivanov, R.D. et al., Electron Mirror Observation of Thin-Film Metal-Semiconductor and Metal-Dielectric Contacts, Soviet Physics—Technical Physics, Jan. 1968, pp. 982-985, vol. 12, No. 7.

Bauer, E. et al., Low Energy Electron Microscopy (LEEM) and Photoemission Microscopy (PEEM) of Semiconductor Surfaces, 1989, pp. 283-294.

Igras, E. et al., Electron Mirror Observations of Impurity Segregations on a Silicon Surface, Phys. Stat., 1966, pp. 169-174, vol. 13, No. 169.

Mayer, Ludwig, Stereo-Micrographs of Conductivity, Journal of Applied Physics, Feb. 1957, pp. 259-262, vol. 28, No. 2.

Igras, E. et al., Electron Mirror Observations of Semiconductor Surfaces at Low Temperatures, Phys. Stat., 1965, pp. 79-85, vol. 9, No. 79.

Igras, E. et al., Electron Mirror Obervation of Lithium Precipitation at Scratch-Induced Dislocations in Silicon, Phys. Stat., 1967, pp. 67-69, vol. 19.

Griffith, Hayes, O. et al., Low-energy Electron Microscopy (LEEM) and Mirror Electron Microscopy (MEM) of Biological Specimens: Preliminary Results with a Novel Beam Separating System, Journal of Microscopy, Dec. 1992, pp. 249-258, vol. 168, Pt. 3.

Tsuno, K., Simulation of a Wien Filter as Beam Separator in a Low Energy Electron Microscope, Ultramicroscopy, 1994, pp. 127-140, vol. 55.

Bok, A.B. et al., Mirror Electron Microscopy, Advances in Optical and Electron Microscopy, 1971, pp. 161-261, vol. 4, Academic Press, London and New York.

* cited by examiner

Fig. 5 (A) (B)
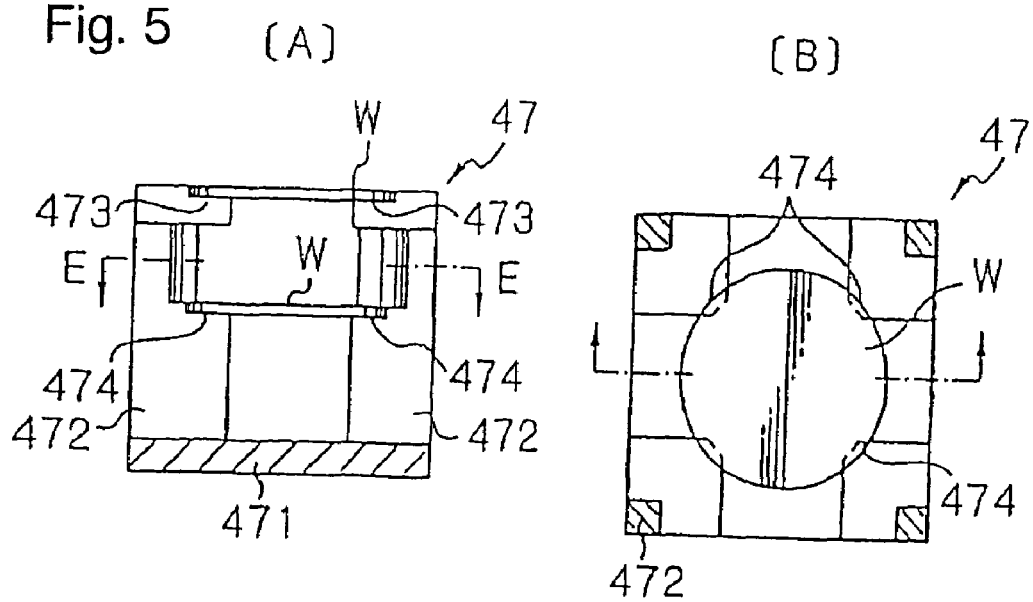
Fig. 6
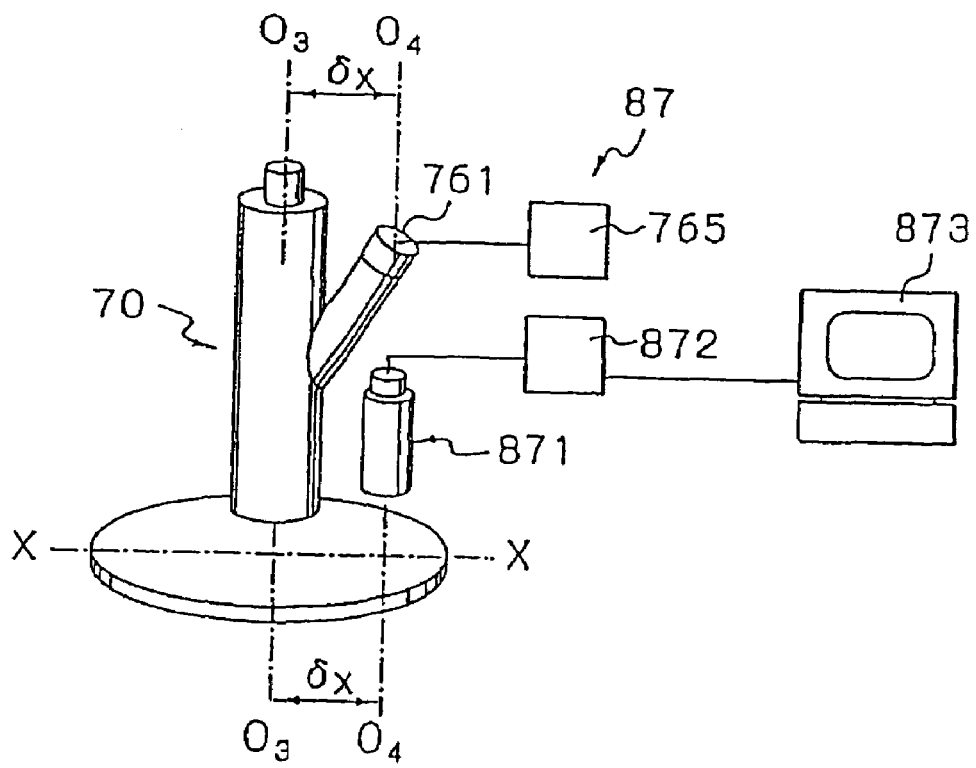

Fig. 13

| DIE No. | DEFECT No. | X COORDINATE | Y COORDINATE |
|---------|------------|--------------|--------------|
| 25      | 1          | 4381.5       | 38467.1      |
| 18      | 2          | .            | .            |
| 3       | 3          | .            | .            |
| .       | .          | .            | .            |
| .       | .          | .            | .            |
| .       | .          | .            | .            |

DIE MAP SCREEN

16 DOTS

OPERATION A      OPERATION B
(A)                   (B)

DIE TO BE INSPECTED

ELECTRON BEAM APPARATUS WITH DETAILED OBSERVATION FUNCTION AND SAMPLE INSPECTING AND OBSERVING METHOD USING ELECTRON BEAM APPARATUS

CROSS-REFERENCE TO RELATED APPLICATIONS

This application is a Divisional of U.S. patent application Ser. No. 11/019,111, filed Dec. 22, 2004, now U.S. Pat. No. 7,212,017, the entire contents of which are hereby incorporated by reference.

BACKGROUND OF THE INVENTION

The present invention relates to a sample observing method for inspecting, observing or evaluating features and electric continuity (electron beam testing) on a sample surface by using an electron beam apparatus, and also to a manufacturing method for fabricating a device by using said sample observing method; and more specifically relates to an inspecting method for inspecting a sample (e.g., a wafer) having a device pattern with a minimum line width equal to or smaller than 0.1 µm for defects with high throughput as well as high accuracy and high reliability, and also to a manufacturing method for fabricating a device, which allows for an improvement in yield by using said inspecting method to inspect the wafer or the like in the course of processing.

There is a known technology according to the prior art, including an apparatus for detecting a defect and an inspection method employing such an apparatus, in which a defect can be detected by firstly irradiating an electron beam on a wafer surface in spots so as to provide scanning across the wafer surface, secondly detecting secondary or reflected electrons emanating from the wafer, and then generating wafer image data from a detection signal of the secondary electrons, which data is in turn used to make a comparison between the image data on a cell-to-cell basis on the wafer or a comparison between image data of one die and image data of any adjacent die for detecting the defect, and also including an inspection apparatus of image projection type and an inspection method employing the same apparatus, in which a defect is detected by firstly irradiating an electron beam on a wafer, and then magnifying secondary electrons or reflected electrons emanating from the wafer via a multi-lens system including an objective lens/a projection lens to thereby make an image of secondary electrons on a detecting unit serving to detect the defect. Such a known technology is disclosed in the following reference documents.

Reference document (1)
  Japanese Patent Laid-open Publication No. Hei 7-249393

Reference document (2)
  Japanese Patent Laid-open Publication No. Hei 11-132975

SUMMARY OF THE INVENTION

An electron beam apparatus of a scanning electron microscope (hereafter referred to as SEM) type allows for inspection of a sample surface with higher resolution as compared to an inspection apparatus of optical type by irradiating an electron beam onto the sample surface to perform the sample inspection. Also, high throughput can be achieved in an inspection using the electron beam apparatus of image projection type, since the electron beam is used to apply a batch illumination to a large area on the sample. In a case of detecting a defect in a sample, such as a wafer, by using the above-stated electron beam apparatus, typically at first, a defect coordinate is extracted through a comparison in the image data on a cell-to-cell basis on the wafer, or a comparison between image data for one die and image data for any adjacent die, and then, independently of the electron beam apparatus, an observation unit such as an SEM review unit, operable to determine a specific type of the defect, is used to perform a detailed geometric observation in the extracted defective region. Further, an automatic defect classification is carried out to provide a feedback of failure analysis to a wafer manufacturing process. Thus, in the prior art relying on the use of a separate unit such as an SEM review unit for the detailed observation, inherently a time period is required to transfer the wafer to said separate unit, which is a critical factor leading to increased inspection time. Further, since two units, the electron beam apparatus plus the SEM review unit, are both necessary, problematically a floor area in a clean room must be extended.

An object to be achieved by the present invention is to provide a sample observing method allowing for detailed observation of a sample using a single electron beam apparatus rather than using a separate unit exclusively for the detailed observation as practiced in the prior art.

Another object to be achieved by the present invention is to provide a sample observing method allowing for simultaneous defect coordinate extraction and detailed observation to be performed in real time and in parallel correspondence with the sample inspection, to thereby reduce the inspection time.

Yet another object to be achieved by the present invention is to provide a method for manufacturing a device, which uses one of the above-described sample observing methods to evaluate the sample in the course of processing.

The above-stated objects are achieved by the following means. Specifically, according to one invention disclosed in the present application, a sample observing method for performing observation of a sample surface using electron beam irradiation is provided, which method comprises the steps of: irradiating an electron beam directed to a sample surface and detecting electrons consequently emanating from said sample surface to thereby provide an inspection of said sample surface; extracting a defective region in the sample based on the inspection; and irradiating the electron beam once again to said extracted defective region to thereby provide magnification or detailed observation of said defective region.

In one embodiment of a sample observing method according to the present invention, said electron beam to be irradiated on said sample surface is composed of a plurality of electron beams, wherein the inspection of the sample surface is performed with at least one electron beam of said plurality of electron beams and said detailed observation is performed with the rest of said plurality of electron beams.

In another embodiment of a sample observing method according to the present invention, an electron beam apparatus for performing said inspection of the sample surface is an apparatus having an optical system of image projection type and capable of performing both of said inspection of the sample surface and said detailed observation.

In yet another embodiment of a sample observing method according to the present invention, a large-magnification observation mode of image projection type is employed in said detailed observation.

In still another embodiment of a sample observing method according to the present invention, an optical system of image projection type is used in said inspection of the sample surface and an optical system of scanning electron microscope type having a secondary electron detector positioned in the vicinity of the sample is used in said detailed observation.

In yet another embodiment of a sample observing method according to the present invention, a line sensor is arranged in a secondary optical system of said electron beam apparatus for performing said inspection of the sample surface, wherein said inspection of the sample surface and said detailed observation are simultaneously performed while the sample or a wafer stage is continuously moving.

In still another embodiment of a sample observing method according to the present invention, a control electrode is arranged between an objective lens and the sample in a primary optical system of said electron beam apparatus for performing said inspection of the sample surface, wherein said control electrode is applied with a potential in a range of 0 V to 10 kV relative to a wafer potential so as to intensify an electric field between the sample and said control electrode and thus improve secondary electron collection efficiency and/or reduce distortion of the secondary electron, and performs said inspection of the sample surface and said detailed observation.

In yet another embodiment of a sample observing method according to the present invention, a control electrode is arranged between an objective lens and the sample in a primary optical system of said electron beam apparatus for performing said inspection of the sample surface, wherein said control electrode is applied with a potential in a range of 1 V to −1 kV relative to a wafer potential so as to decrease a potential difference between the sample and said control electrode and thus increase an optical magnification and/or suppress a discharge for performing said inspection of the sample surface and said detailed observation.

According to a further invention disclosed in the present application, a method for manufacturing a device, in which a sample observing method as described above is used to evaluate a wafer in the course of processing.

According to another invention disclosed in the present application, an electron beam apparatus for performing observation of a sample surface using an electron beam irradiation is provided, which comprises: a primary optical system for shaping an electron ray from an electron source into an electron beam to irradiate on a sample surface; a secondary optical system for projecting an image of secondary electrons emanating as a result of said irradiation of the electron beam and detecting the projected image of the secondary electrons; and an image processing unit for performing an inspection of the detected sample surface and a detailed observation, wherein said image processing unit is adapted to extract a defective region in the sample based on an inspection result and to perform a magnification or a detailed observation of said defective region based on data obtained by irradiating once again the electron beam to said extracted defective region.

In another embodiment of an electron beam apparatus according to the present invention, said electron beam apparatus includes a primary optical system for irradiating a plurality of electron beams, wherein said apparatus performs the inspection of the sample surface with at least one of said plurality of electron beams and said detailed observation with the rest of said plurality of electron beams.

In another embodiment of an electron beam apparatus according to the present invention, said electron beam apparatus is an apparatus including an optical system of image projection type and is configured so as to perform both of said inspection of the sample surface and said detailed observation.

In another embodiment of an electron beam apparatus according to the present invention, an optical condition in said electron beam apparatus may be set to a large-magnification observation mode of image projection type for said detailed observation.

In another embodiment of an electron beam apparatus according to the present invention, said electron beam apparatus comprises an optical system of image projection type and an optical system of scanning electron microscope type having a secondary electron detector disposed in the vicinity of the sample, wherein said inspection of the sample surface is performed by said optical system of image projection type and said detailed observation is performed by said optical system of scanning electron microscope type.

In another embodiment of an electron beam apparatus according to the present invention, a line sensor is arranged in the secondary optical system of said electron beam apparatus so that said inspection of the sample surface and said detailed observation may be simultaneously performed while the sample of a wafer stage is moving continuously.

In another embodiment of an electron beam apparatus according to the present invention, a control electrode is arranged between an objective lens and the sample in the primary optical system in said electron beam apparatus, wherein said control electrode is applied with a potential in a range of 0 V to 10 kV relative to a wafer potential so as to intensify an electric field between the sample and said control electrode and thus improve secondary electron collection efficiency and/or reduce distortion of the secondary electron, and performs said inspection of the sample surface and said detailed observation.

In yet another embodiment of an electron beam apparatus according to the present invention, a control electrode is arranged between the objective lens and the sample in the primary optical system in said electron beam apparatus, wherein said control electrode is applied with a potential in a range of 1 V to −1 kV relative to the wafer potential so as to decrease a potential difference between the sample and said control electrode and thus increase an optical magnification and/or suppress a discharge for performing said inspection of the sample surface and said detailed observation.

The present invention enables the detailed observation of the sample to be performed by one and the same electron beam apparatus by using the electron beam apparatus comprising the primary optical system serving to irradiate the electron beam and the secondary optical system serving to detect the secondary electrons and forming the image of the sample surface, in which firstly the electron beam is irradiated on the sample surface to perform the inspection of the sample surface, secondly the defective region in the sample is extracted based on the inspection image, and then the electron beam is irradiated once again to the extracted defective region to thereby execute the magnification or the detailed observation of the defective region.

The present invention also enables the defect coordinate extraction and the detailed observation to be performed simultaneously in real time and in parallel correspondence with the sample inspection by simultaneously executing inspection and detailed observation of the sample surface while moving continuously the sample with the aid of the line sensor arranged in the secondary optical system of the electron beam apparatus.

Further, the application of a sample observing method according to the present invention to the inspection process of a semiconductor device allows for the inspection with high throughput to be achieved even for a semiconductor device having fine pattern. Thus 100% inspection, improvement in yield of products as well as avoidance of shipping any defective products can be successfully achieved.

BRIEF DESCRIPTION OF THE DRAWINGS

FIG. 5 shows enlarged views of a wafer rack, wherein [A] is a side elevation view of the wafer rack and [B] is a sectional view of the wafer rack taken along the line E-E of [A];

FIG. 6 is a schematic view generally illustrating an alignment controller for a wafer;

FIG. 13 shows a list of defect data;

DESCRIPTION OF THE PREFERRED EMBODIMENTS

1. Semiconductor Inspection Apparatus

Before explaining a sample observing method and its associated electron beam apparatus for performing an observation on a sample surface according to the present invention, a general description will at first be given on a semiconductor inspection apparatus for performing an inspection of a substrate including a pattern formed on its surface, or a wafer, taken as a sample to be observed.

Figure 1:
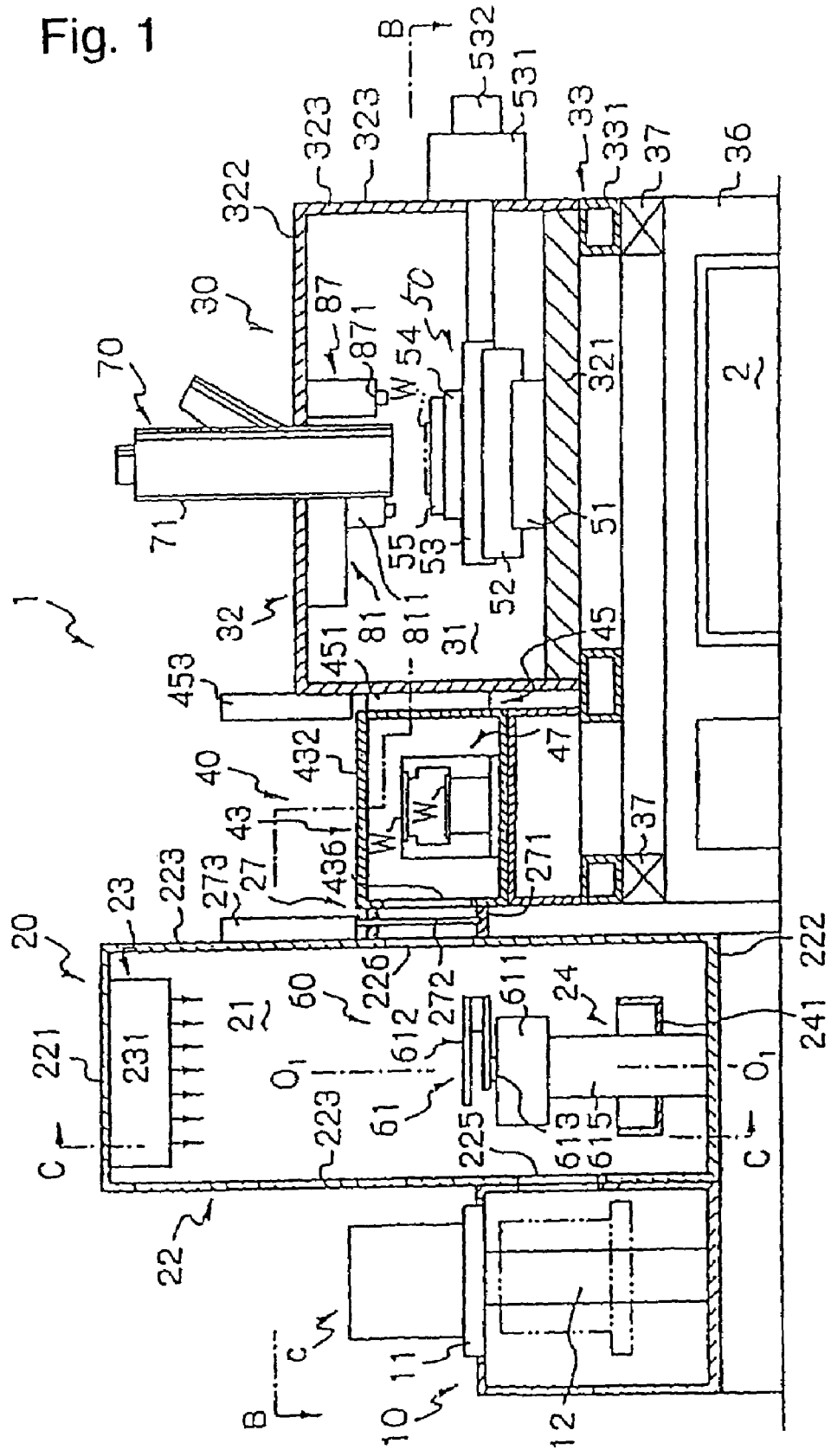
FIG. 1 is an elevation view showing main components of an inspection apparatus according to the present invention, taken along the line A-A of FIG. 2.
Figure 2:
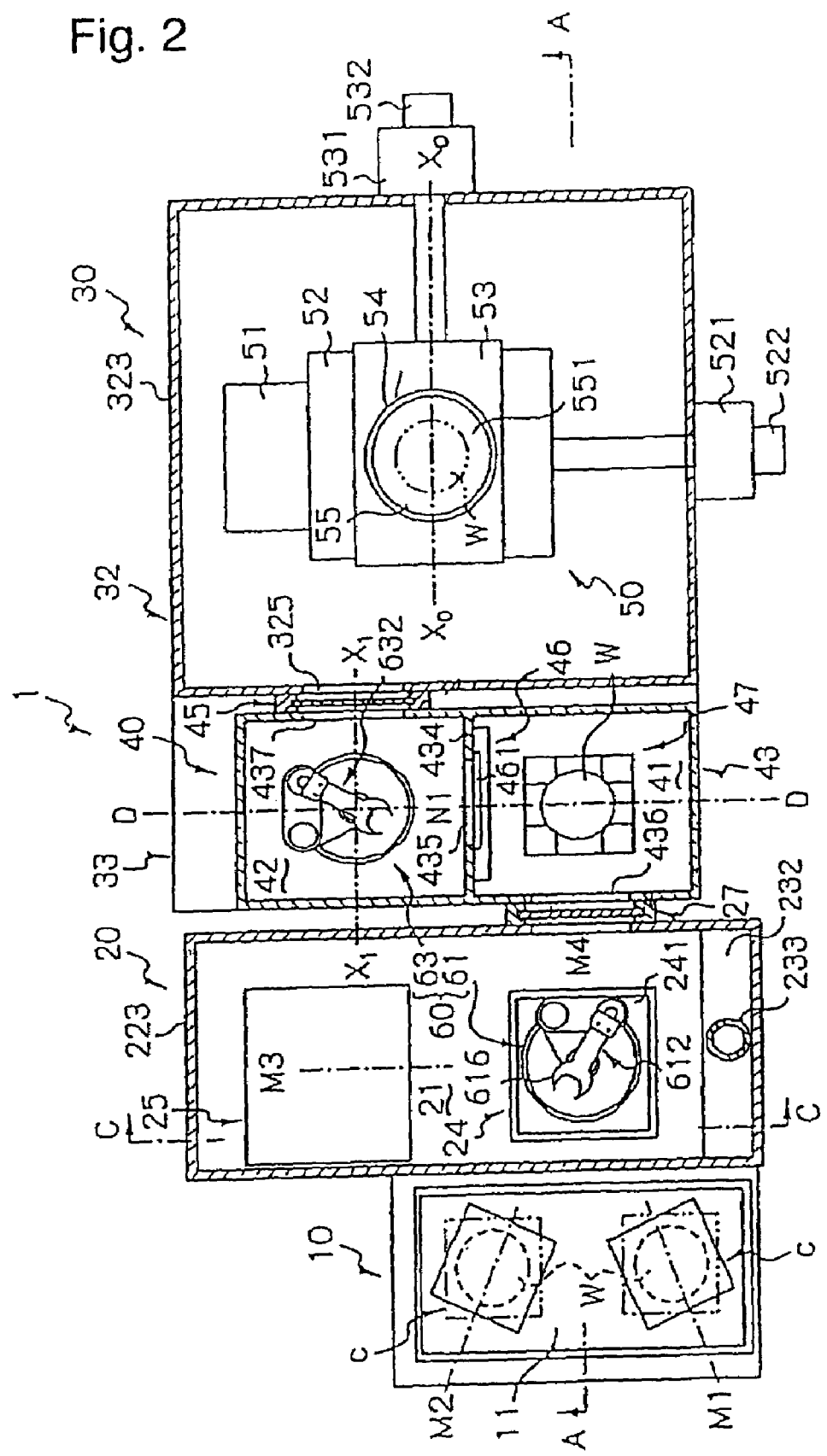
FIG. 2 is a plan view showing main components of the inspection apparatus shown in FIG. 1, taken along the line B-B of FIG. 1.

In FIGS. 1 and 2, main structural elements of the semiconductor inspection apparatus 1 are disclosed in a side-view and a plane-view, respectively.

The semiconductor inspection apparatus 1 according to the present embodiment comprises: a cassette holder 10 for holding a cassette containing a plurality of wafers "W"; a mini-environment unit 20; a main housing 30 defining a working chamber 31; a loader housing 40 located between the mini-environment unit 20 and the main housing 30 and defining two loading chambers; a loader 60 for picking up the wafer W from the cassette holder 10 and loading it on a stage device 50 located within the main housing 30; and an electron optical device 70 attached to a vacuum housing, all of which are arranged in such a physical relationship as depicted in FIGS. 1 and 2. The semiconductor inspection apparatus 1 further comprises a pre-charging unit 81 located within the main chamber 30 which is under a vacuum condition; and an optical microscope 871 constituting an alignment controller 87 for positioning the wafer on the stage device 50.

The cassette holder 10 is designed to hold a plurality (two pieces in this embodiment) of cassettes "c" (e.g., a closed cassette, such as FOUP manufactured by Assist Inc.), each containing a plurality (e.g., 25 pieces) of wafers W placed side by side in parallel with each other along the up and down direction. This cassette holder 10 may employ a suitable structure depending on the specific cases selectively such that for a case where the cassette is transferred by a robot or the like and loaded onto the cassette holder 10 automatically, a specific suitable structure therefor may be employed and that for a case where the loading operation is manually carried out, an open cassette structure suitable therefor may be employed. In this embodiment, the cassette holder 10 is a type into which the cassette c is automatically loaded, and comprises, for example, an lifting table 11 and an lifting mechanism 12 for moving up and down the lifting table 11, wherein the cassette c is set on the lifting table 11 automatically in a state illustrated by the chain line in FIG. 2, and after having been set, the cassette c is rotated automatically into an orientation illustrated by the solid line in FIG. 2 for heading to an axial line of rotational movement of a first transport unit within the mini-environment unit 20. In addition, the lifting table 11 is lowered down to the position indicated by the chain line in FIG. 1. The cassette holder used in the case of the automatic loading or the cassette holder used in the case of the manual loading may appropriately employ any known structures, and detailed description of its structure and function should be herein omitted.

The wafers contained in the cassette c are those subject to the inspection, and such an inspection may be carried out after or in the course of a process for processing the wafer in the series of processes for manufacturing the semiconductor. Specifically, those substrates or wafers that have experienced the film-depositing step, the CMP step, the ion implantation step and the like, or those wafers that have been or have not been patterned on the surfaces thereof may be accommodated in the cassette. A plurality of those wafers W are accommodated in the cassette c so as to be spaced in parallel with each other along the up and down direction. For this reason, an arm of the first transport unit (as will be described later) is adapted to move up and down so that the wafer W in a desired position can be held by the first transport unit.

Figure 3:
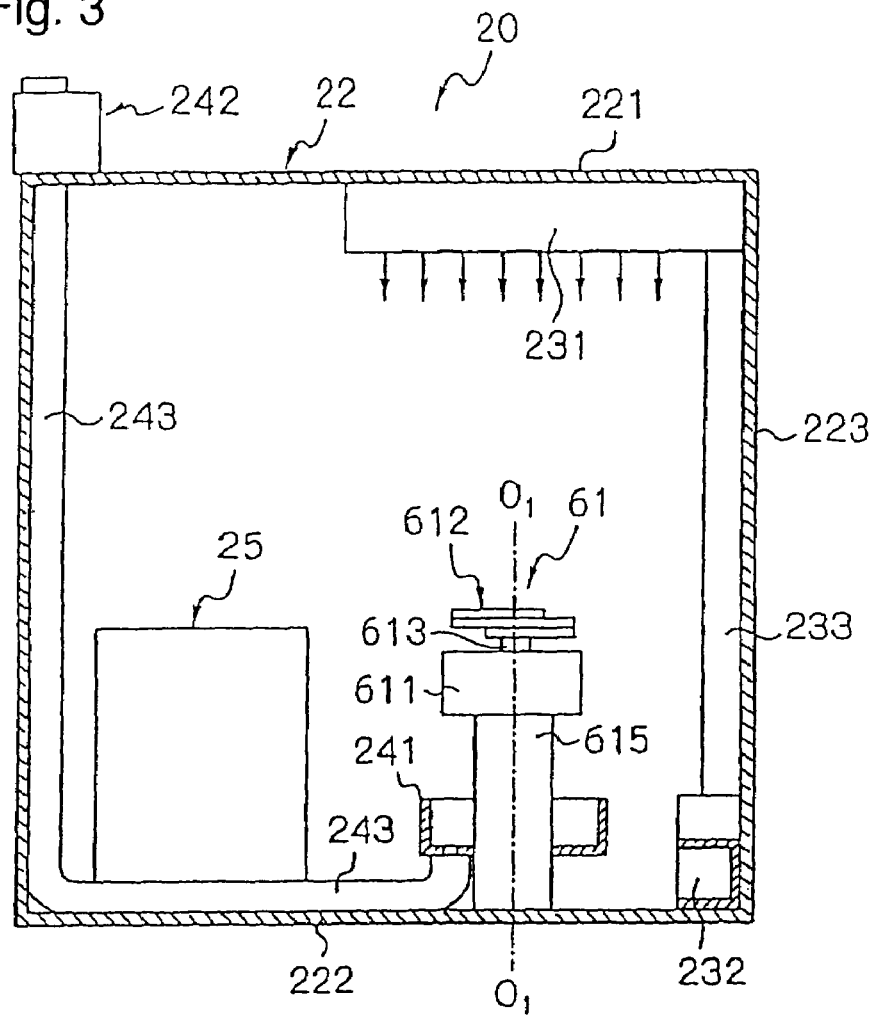
FIG. 3 is a sectional view showing a mini-environment unit of FIG. 1, taken along the line C-C of FIG. 1.

In FIGS. 1 through 3, the mini-environment unit 20 comprises: a housing 22 defining a mini-environment space 21 of which atmosphere may be controlled; a gas circulator 23 for providing the atmosphere control by circulating a gas such as a clean air within the mini-environment space 21; an exhausting device 24 for recovering and then exhausting a portion of the air supplied into the mini-environment space 21; and a pre-aligner 25 arranged within the mini-environment space 21 for providing a coarse alignment of the wafer W subject to the inspection.

The housing 22 comprises a top wall 221, a bottom wall 222 and circumferential walls 223 surrounding four circumferential portions so as to provide a structure. to separate the mini-environment space 21 from an external environment.

In order to provide the atmosphere control of the mini-environment space, the gas circulator 23 comprises, as shown in FIG. 3, a gas supply unit 231 which is attached to the top wall 221 within the mini-environment space for cleaning a gas (air in this embodiment) and then directing a laminar flow of thus cleaned air right below through one or more gas blow-off openings (not shown); a recovery duct 232 located on the bottom wall 222 within the mini-environment space 21 for recovering the air that has flown down toward the bottom; and a conduit 233 interconnecting the recovery duct 232 and the gas supply unit 231 for returning the recovered air back to the gas supply unit 231. The laminar flow of the clean air directed downward, or the down flow, is supplied such that it can flow mainly through a conveying surface of the first transport unit 61 located within the mini-environment space 21 to thereby prevent any dust which could be produced by the transport unit 61 from adhering to the wafer W. An access port 225 is formed in a location of the circumferential wall 223 of the housing 22 adjacent to the cassette holder 10.

The exhausting device 24 comprises: a suction duct 241 disposed in a location lower than the wafer conveying surface of said transport unit 61 and in the lower portion of the transport unit; a blower 242 disposed external to the housing 22; and a conduit 243 for interconnecting the suction duct 241 and the blower 242. This exhausting device 24 sucks the gas flowing down along the circumference of the transport unit and containing the dust which could be produced by the transport unit, through the suction duct 241, and exhausts that air to the outside of the housing 22 via the conduits 243, 244 and the blower 242.

The aligner 25 disposed within the mini-environment space 21 is designed to detect optically or mechanically an orientation-flat formed in the wafer W (referred to a flat portion formed in an outer periphery of a circular wafer) or one or more V-shaped cut-out or notch formed in an outer peripheral edge of the wafer, and is adapted to provide in advance an alignment of the wafer in the rotational direction around the axis O-O of the wafer within an accuracy of ±1 degree. The pre-aligner 25 is a constitutional part of a mechanism for determining a coordinate of a subject to be inspected in the invention specified in the claims, and takes a role in providing a coarse alignment of the subject to be inspected. Since the pre-aligner 25 may be of any known structure, description of its structure and function should be omitted.

In FIG. 1 and FIG. 2, the main housing 30 defining the working chamber 31 comprises a housing main body 32. The housing main body 32 is supported by a housing supporting device 33 loaded on a vibration insulating device or a vibration isolating device 37 located on a table frame 36 and the housing supporting device 33 comprises a frame structure 331 assembled into a rectangular shape. Thus, the housing main body 32 is disposed and mounted securely onto the frame structure 331. The housing main body 32 comprises a bottom wall 321 loaded on the frame structure 331, a top wall 322 and circumferential walls 323 connected to both of the bottom wall 321 and the top wall 322 to surround four circumferential portions, thereby isolating the working chamber 31 from the outside.

In this embodiment, the housing main body 32 and the housing supporting device 33 is assembled in a rigid structure, wherein the vibration isolating device 37 prevents the vibration from the floor on which the table frame 36 is installed from being transmitted to this rigid structure. An access port 325 for taking in and out the wafer is formed in one circumferential wall among those circumferential walls 323 of the housing main body 32, which is adjacent to a loader housing 40.

The working chamber 31 is designed to be held in a vacuum atmosphere by a vacuum device (not shown) having a known structure. A controller 2 for controlling an overall operation of the apparatus is located under the table frame 36.

Figure 4:
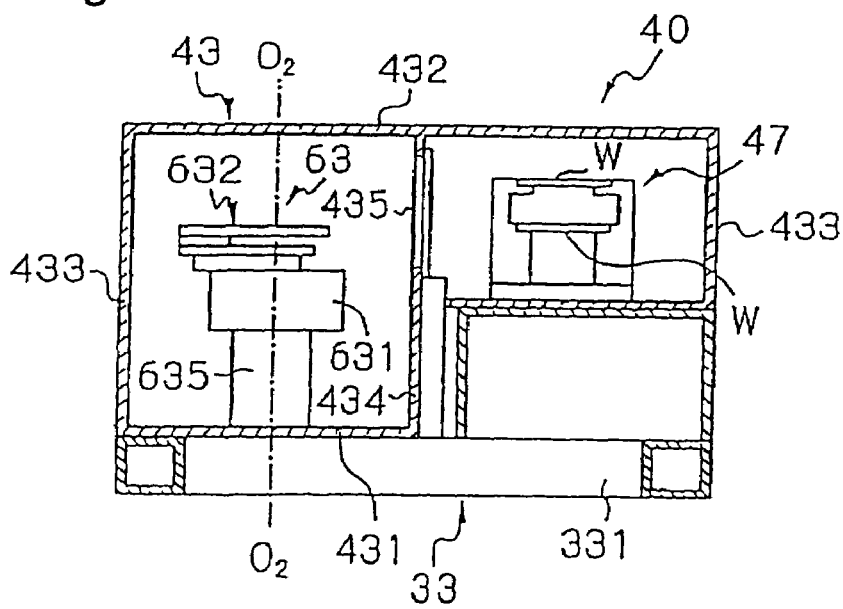
FIG. 4 is a diagram showing a loader housing of FIG. 1, taken along the line D-D of FIG. 2.

Referring to FIGS. 1, 2 and 4, the loader housing 40 comprises a housing main body 43 defining a first loading chamber 41 and a second loading chamber 42. The housing main body 43 comprises a bottom wall 431, a top wall 432, circumferential walls 433 surrounding four circumferential portions and a partition wall 434 for separating the first loading chamber 41 and the second loading chamber 42, so that both loading chambers 41 and 42 may be isolated from the external environment. An access port 435 is formed in the partition wall 434 for passing the wafer between two loading chambers 41 and 42. Further, access ports 436 and 437 are formed in locations of the circumferential walls 433 adjacent to the mini-environment unit 20 and the main housing 30, respectively. Since the housing main body 43 of this loader housing 40 is mounted on and supported by the frame structure 331 of the housing supporting device 33, this loader housing 40 is also designed to be protected from any vibrations otherwise transmitted from the floor. The access port 436 of the loader housing 40 and the access port 226 of the housing 22 of the mini-environment unit 20 are aligned and interconnected with each other, and in a connecting point therebetween a shutter system 27 is arranged so as to selectively block the communication between the mini-environment space 21 and the first loading chamber 41. The access port 437 of the loader housing 40 and the access port 325 of the housing main body 32 are aligned and interconnected with each other, and in a connecting point therebetween a shutter system 45 is arranged so as to selectively seal and block the communication between the second loading chamber 42 and the working chamber 31. Further, the opening formed in the partition wall 434 is provided with a shutter system 46 which selectively blocks the communication between the first and the second loading chambers 41 and 42 by closing or opening a door 461. Those shutter systems 27, 45 and 46 are designed to provide an airtight sealing to each loading chamber when they are in closed positions.

In the first loading chamber 41, a wafer rack 47 is arranged, which holds a plurality (two pieces, in this embodiment) of wafers in a horizontal state to be spaced from each other in the up and down direction.

The loading chambers 41 and 42 are adapted to have the atmosphere controlled to be high vacuum condition (in a range of $10^{-5}$ to $10^{-6}$ Pa as a vacuum level) by the aid of a well-known vacuum exhausting device (not shown) including vacuum pump, though not shown. In that case, the first loading chamber 41 may be held in a lower vacuum atmosphere as a low vacuum chamber, while the second loading chamber 42 may be held in a higher vacuum atmosphere as a high vacuum chamber, thereby providing an effective way to prevent the contamination of the wafer W. Employing such the loading chambers, not only can help transfer the subsequent wafer W that is accommodated in the loading chamber and is to be subjected to a defect inspection into the working chamber 31 without delay, but also can help improve the throughput of the defect inspection and further help maintain the vacuum level in the surrounding of the electron beam source, which is required to be held in a high vacuum condition, at as high vacuum conditions as possible.

The first and the second loading chambers 41 and 42 are connected with a vacuum exhausting pipe (not shown) and a vent pipe (not shown) for an inactive gas (e.g., purified dry nitrogen), respectively. With this arrangement, atmospheric condition in each loading chamber can be attained with the aid of the injective gas vent (injecting the inactive gas into each loading chamber can prevent an oxygen gas and the like other than the inactive gas from adhering to the surface of each chamber).

It is to be noted that in an inspection apparatus using an electron beam according to the present invention, it is important that a substance represented by lanthanum hexaboride ($LaB_6$) that can be used as an electron beam source of an electron optical device should not be brought into contact with oxygen as much as possible after it is heated up to such a high temperature where the thermal electron is emitted therefrom in order not to reduce a lifetime thereof. As it is, this can be ensured by applying the atmosphere control as described above to the working chamber in which the electron optical device is installed, in a step prior to a transfer operation of the wafer thereinto.

The stage device 50 comprises: a stationary table 51 located on the bottom wall 321 of the main housing 30; a Y table 52 operatively mounted on the stationary table 51 to be capable of moving in the Y direction (the direction orthogonal to the sheet surface in FIG. 1); an X table 53 operatively mounted on the stationary table 51 to be capable of moving in the X direction (the left and right direction in FIG. 1); a turntable 54 capable of rotating on the X table 53; and a holder 55 located on the turntable 54. The wafer is releasably loaded on a wafer loading surface 551 of the holder 55. The holder may have a known structure allowing for the wafer to be releasably gripped in a mechanical manner or by an electrostatic chuck system. The stage device 50 is adapted to provide a highly precise alignment of the wafer W held in the holder 55 on the loading surface 551 with respect to the electron beam irradiated from the electron optical device in the X direction, Y direction and Z direction (i.e., the up and down direction in FIG. 1) as well as in the rotational direction around the axial line orthogonal to the supporting surface of the wafer (i.e., in the θ direction), by actuating the plurality of tables 51 to 54 described above using a servo motor, an encoder and a variety of sensors (not shown).

It is to be noted that the positioning of the wafer in the Z direction may be achieved by, for example, making the position of the loading surface 551 on the holder 55 to be fine-tunable. In these operations, a reference position of the loading surface 551 is detected by a position measuring device employing laser having very fine diameter (laser interference range finder using a principle of interferometer) and said position is controlled by a feedback circuit (not shown) and in association with or instead of the above control, the position of the notch or the orientation-flat of the wafer is measured to detect a position within a plane and a rotational position of the wafer with respect to the electron beam, and the turntable is rotated by, for example, a stepping motor capable of fine angle controlling so as to control the position of the wafer. In order to prevent or minimize any production of dust within the working chamber 31, the servo motors 521 and 531 and the encoders 522 and 532 for the stage device 50 are disposed external to the main housing 30.

It is to be noted that the reference can be set for the signal obtained by inputting in advance the rotational position and/or the position in the X- and the Y-directions of the wafer with respect to the electron beam to a signal detecting system or an image processing system, both of which will be described later.

The loader 60 comprises a first transport unit 61 of a robot system located within the housing 22 of the mini-environment unit 20 and a second transport unit 63 of a robot system located within the second loading chamber 42.

The first transport unit 61 has a multi-joint arm 612 capable of rotating around an axial line $O_1$-$O_1$ with respect to a driving section 611. The multi-joint arm may employ any arbitrary structure, and in the illustrated embodiment, the arm 612 includes three parts operatively joined so as to be movable rotationally with respect to each other. A part of the arm 612 of the first transport unit 61, that is the first part which is located in the closest position to the driving section 611, is attached to a shaft 613 which may be driven to rotate by a driving mechanism of known structure (not shown) arranged in the driving section 611. The arm 612 can rotate around the axial line $O_1$-$O_1$ with the aid of the shaft 613, while it can be extended or contracted in the radial direction with respect to the axial line $O_1$-$O_1$ as a whole unit by a relative rotation among the parts. A tip portion of a third part of the arm 612, which is one of those parts located in the uppermost position, is provided with a gripping device 616 for gripping the wafer W, which is implemented by a mechanical, electrostatic or other type chuck of known structure. The driving section 611 is allowed to move in the up and down direction by an lifting mechanism 615.

The arm 612 of the first transport unit 61 is extended toward either one of the directions for M1 and for M2 between those for two cassettes c held in the cassette holder, and one piece of wafer W accommodated in the cassette c is placed onto the arm or gripped by the chuck (not shown) attached to the tip portion of the arm 612, so as to be taken out of it. After that, the arm 612 is contracted (into the state shown in FIG. 2), and then is rotated to and stopped at a position from which it can be extended toward the direction M3 for the pre-aligner 25. As it is, the arm is again extended so as to place the wafer W held by the arm 612 onto the pre-aligner 25. The arm, after the pre-aligner 25 having applied a fine-tuning of the orientation of the wafer W, receives the wafer from the pre-aligner 25 and then the arm 612 is further rotated to and stopped at a position in which the arm is allowed to be extended toward the first loading chamber 41 (in the direction M4), where it is extended so as to hand over the wafer to a wafer receiver 47 within the first loading chamber 41. In a case of gripping the wafer W mechanically, preferably a circumferential edge region (a range within about 5 mm from the circumferential edge) should be gripped. This is because the wafer W is in its inner surface entirely patterned with devices (circuit wirings) only excluding the circumferential edge region, and accordingly gripping of the wafer W in that patterned region could cause a breakage of the device and a defect therein.

The second transport unit 63 has basically the same structure as the first transport unit 61, but it is operable so that the transfer operation of the wafer W is performed between the wafer rack 47 and the loading surface 551 of the stage device 50.

In said loader 60, the first and the second transport units 61 and 63 carry out the transfer operation of the wafer as it is held in the horizontal state from the cassette held by the cassette holder onto the stage device 50 located within the working chamber 31 and vice versa. The up and down motions of the arms 612 and 632 of the transport units 61 and 63 are limited only to the steps where the wafer is taken out of or inserted into the cassette c, where the wafer is placed on or taken out of the wafer rack, and where the wafer is placed on or taken out of the stage device 50. Therefore, even the transfer of such a large wafer having a 30 cm diameter, for example, can be carried out smoothly.

The transfer operations of the wafer from the cassette c carried by the cassette holder onto the stage device 50 located in the working chamber 31 will now be described.

As for the cassette holder 10, a suitable structure may be selectively employed therefor, as already set forth, depending on particular cases, including one for the manual setting of the cassette and another for the automatic setting of the cassette. In this embodiment, once the cassette c is set on the lifting table 11 of the cassette holder 10, the lifting table 11 is lowered by the lifting mechanism 12 and the cassette c is aligned with the access port 225.

When the cassette c is aligned with the access port 225, the cover (not shown) arranged in the cassette c is opened, and at the same time, a cylindrical cover is disposed between the cassette c and the access port 225 so as to block the interior of the cassette c and the space inside of the mini-environment unit 21 from the external environment. It is to be noted that in the case where the shutter system for opening and closing the access port 225 is arranged in the mini-environment unit 20, that shutter system should be actuated to open the access port 225.

The arm 612 of the first transport unit 61 is stopped as it is oriented to either of the direction M1 or M2 (In this description, the direction of M1). When the access port 225 is opened, the arm 612 is extended through the access port 225 to receive one of the wafers accommodated in the cassette by its tip portion.

Once the receiving operation of the wafer by the arm 612 is completed, the arm 612 is contracted and said shutter system is actuated to close the access port 225 (in case that the shutter system is installed). Then, the arm 612 is rotated around the axial line $O_1$-$O_1$ and stopped in a position allowing for the arm 612 to be extended toward the direction M3. Subsequently, the arm 612 is extended and places the wafer W loaded on its tip portion or gripped by the chuck onto the pre-aligner 25, which in turn determines the orientation of the rotational direction of the wafer (the direction around the central axis line orthogonal to the wafer plane) to be set within a specified range. Once the alignment operation has been completed, the transport unit 61, after having received the wafer from the pre-aligner 25 onto the tip portion of the arm 612, contracts its arm and takes a posture ready to extend the arm 612 toward the direction M4. Then, the door 272 of the shutter system 27 is moved to open the access ports 226 and 436, so that the arm 612 is extended into the first loading chamber 42 and loads the wafer into the upper step side or the lower step side of the wafer rack 47. It is to be noted that, as described above, before the shutter system 27 goes into the open position to allow the wafer W to be transferred to the wafer rack 47, the opening 435 defined in the partition wall 434 would have been closed to be airtight by the door 461 of the shutter system 46.

In the course of transfer operation of the wafer by the first transport unit 61, clean air flows down in a laminar flow (as the down flow) from the gas supply unit 231 arranged in the upper side of the housing 22 of the mini-environment unit 20 so as to prevent the dust from adhering to the top surface of the wafer W during its transfer operation. A portion of the air in the surrounding of the transport unit (In this embodiment, about 20% of the air supplied from the supply unit is mainly contaminated air) is sucked through the suction duct 241 of the exhausting device 24 and exhausted to the outside of the housing. The remaining portion of the air is recovered via the recovery duct 232 disposed in the bottom of the housing 22 and returned back to the gas supply unit 231.

Once the wafer has been loaded in the wafer rack 47 within the first loading chamber 41 by the first transport unit 61, the shutter system 27 is actuated into the closed position to close the loading chamber 41. Subsequently, the first loading chamber 41 is filled with an inactive gas to purge the air, and after that said inactive gas is also exhausted to bring the interior of the loading chamber 41 into the vacuum atmosphere. The vacuum atmosphere of the first loading chamber 41 may be set at a low vacuum level. Once a certain degree of vacuum has been obtained in the loading chamber 41, the shutter system 46 is actuated to open the access port 435, which has been closed to be airtight by the door 461, and the arm 632 of the second transport unit 63 is then extended into the first loading chamber 41 and receives one piece of wafer W from the wafer receiver 47 (by placing it on the tip portion of the arm 632 or by gripping it by a chuck installed in the tip portion of the arm 632). After the receiving operation of the wafer W having been completed, the arm 632 is contracted, and the shutter system 46 is again actuated to close the access port 435 by the door 461. It is to be noted that before the shutter system 46 is actuated into the open position, the arm 632 takes a posture ready to extend toward the direction N1 for the wafer rack 47. Further, the access ports 437 and 325 are closed by the door 452 of the shutter system 45 before the shutter system is opened as described above to block the communication between the second loading chamber 42 and the working chamber 31 in the airtight condition and to vacuum evacuated the second loading chamber.

Once the access port 435 have been closed, the second loading chamber 42 is vacuum evacuated and ultimately brought into the vacuum at a higher vacuum level than that in the first loading chamber 42. During this vacuum evacuation of the second loading chamber 42, the arm of the second transport unit 63 is rotated to a position in which it is allowed to extend toward the stage device 50 in the working chamber 31. On one hand, in the stage device within the working chamber 31, the Y table 52 is moved upward in FIG. 2 until the centerline $X_0$-$X_0$ of the X table 53 approximately comes into alignment with the X-axis line $X_1$-$X_1$ crossing the rotational axial line of the second transport unit 63, while at the same time the X table 53 is moved to a position which is the leftmost side position in FIG. 2 and stands by in this state. When the second loading chamber 42 has been brought into the approximately same level of vacuum condition as the working chamber 31, the door 452 of the shutter system 45 is actuated to open the access ports 437 and 325, and the arm is extended into the working chamber 31, such that the tip portion of the arm holding the wafer comes near to the stage device 50 in the working chamber 31 and then places the wafer on the loading surface 551 of the stage device 50. When the loading operation of the wafer W has been completed, the arm is contracted, and the shutter system 45 closes the access ports 437 and 325.

The operations during a process for transferring the wafer in the cassette c onto the stage device have been described, and in the process for returning the wafer, which has been placed on the stage and finished with a predetermined processing, from the stage device back into the cassette c, the operations as described above should be performed in the inverse sequence. Further, since the first transfer unit 61 can transfer the wafer between the cassette c and the wafer rack while the second transfer unit is transferring another wafer between the wafer rack and the stage device so as to keep the plurality of wafers loaded in the wafer rack, the inspection process can be progressed efficiently.

The electron optical device 70 includes an optical column 71 fixed to the housing body 23, in which a first optical system, a second optical system and a detecting system are disposed. The first and second optical system constitute an electron optical system. A detailed explanation of the electron optical device 70 will be made later in connection with embodiments 1 to 5.

The pre-charge unit 81 is arranged within the working chamber 31 in a location adjacent to the optical column 71 of the electron optical device 70, as shown in FIG. 1. The present inspection apparatus employs such a system in which a device pattern or the like formed in the surface of the wafer W is inspected by irradiating the electron beam and scanning thereby the wafer W as an object to be inspected. Accordingly, in operations, the data of the secondary electrons generated by the irradiation of the electron beam are collected as the data of the wafer surface, wherein depending on the material of the wafer, energy of the irradiated electrons and so on, the wafer surface may be occasionally charged (charged-up). In this regard, the wafer surface may possibly have some regions that would be charged intensively and other regions that would be charged moderately. If the wafer surface is not evenly charged, then the secondary electron data should be uneven, inhibiting the acute data from being obtained. To prevent unevenness, the pre-charge unit 81 having a charged particle irradiating section 811 is provided. In order to eliminate the uneven charging, prior to the irradiation of the electrons for the inspection onto a predetermined location on the wafer W to be inspected, charged particles are irradiated from the charged particle irradiating section 811 of the pre-charge unit 81. The charge-up of the wafer surface can be detected by forming in advance an image of the wafer surface to be detected and making an evaluation on said image, and based on the detection result, the pre-charge unit 82 may be actuated.

In the pre-charge unit 81, the primary electron beam may be irradiated in its out-of-focus condition.

This alignment controller 87 is implemented by an apparatus for aligning the wafer W with respect to the electron optical device 70 by using the stage device 50, and it can provide the controls including a coarse aligning of the wafer by a wide field observation of the wafer using an optical microscope 871 (in a lower magnification than that used in the electron optical device 70), an aligning of the wafer in a high magnification by using an electron optical system of the electron optical device 70, a focal adjusting, an inspected region setting, a pattern alignment and the like. The reason the optical system is used to inspect the wafer W in the low magnification is that it is required in order to execute the inspection of the pattern of the wafer W automatically that the alignment mark should be detected easily by the electron beam when the pattern of the wafer W is observed by using the electron beam to thereby make a wafer alignment.

Preferably, the optical microscope 871 is operatively installed within the housing (the optical microscope 871 may be movable within the housing), and a light source (not shown) for actuating the optical microscope 871 is also disposed within the main housing 32. The electron optical system for providing the observation in the high magnification may share the electron optical systems (a primary optical system 701 and a secondary optical system 702) in the electron optical device 70. The schematic structure of the electron optical system is shown in FIG. 6. To make an observation in the low magnification for the point subject to the observation on the wafer, the X-stage 53 of the stage device 50 is moved in the X-direction to bring the point subject to the observation on the wafer into the field of view of the optical microscope 871. The optical microscope 871 is used to look at the wafer through a wide field of view, and the position on the wafer, which is to be observed, is indicated on a monitor 873 via a CCD 872, based on which the point of observation can be determined approximately. In this case, the magnification of the optical microscope may be progressively changed from low to high.

Then, the stage device 50 is moved by a distance corresponding to a spacing δx between an optical axis of the electron optical device 70 and an optical axis of the optical microscope 871 to thereby bring the point on the wafer subject to the observation, which has been previously determined with the optical microscope 871, into the position in the field of view of the electron optical device. In this case, since the distance δx between the axial line $O_3$-$O_3$ of the electron optical device 70 and the optical axis $O_4$-$O_4$ (It is to be noted that although in this illustration the electron optical device 70 and the optical microscope 871 are spaced from each other only along the X-axial line, they may be spaced both along the X- and the Y-axial directions) is known beforehand, only moving the point subject to the observation by the distance δx can bring it into the position for visual recognition by the electron optical device 70. After the point subject to the observation is transferred into the visual recognition point of the electron optical device 70, the SEM image of the point subject to the observation is taken by the electron optical systems of the electron optical device 70 in the high magnification, and said image may be stored and/or may be indicated in a monitor 765 via a CCD 761.

In this way, after the point on the wafer W subject to the observation is indicated on the monitor by the electron optical system in the high magnification, a misalignment of the wafer in the rotational direction with respect to the revolving center of the turntable 54 of the stage device 50, or a misalignment δθ of the wafer W in the rotational direction around the optical axis $O_3$-$O_3$ of the electron optical system, is detected by using a known method, and also a misalignment of a predetermined pattern in the X- and the Y-axial directions with respect to the electron optical device 70 is detected. Based on thus obtained values of detection as well as separately obtained data of the inspection mark formed in the wafer W or the set of data concerning to the geometry of the pattern of the wafer W and the like, the operation of the stage device 50 is controlled to provide the alignment of the wafer W.

2. Embodiments of a Method for Observing Sample

Referring now to FIGS. 7 to 14, preferred embodiments of a method for observing sample according to the present invention using the semiconductor inspection apparatus 1 of FIG. 1 will be described. In this embodiment, the following example are described:

(1) A case where the electron beam apparatus 70 of FIG. 1 is defined as of the image projection type with a single electron beam (a single beam), and the electron beam is irradiated to a sample surface in the direction perpendicular thereto so as to perform an image inspection of a sample, an extraction of a defective region and a detailed observation of the image in the acquired defective region (Example 1);

(2) A case where the electron beam apparatus 70 of FIG. 1 is defined as of the image projection type with a single electron beam (a single beam), and the electron beam is irradiated to a sample surface from an oblique direction relative thereto so as to perform an image inspection of a sample, an extraction of a defective region and a detailed observation of the image in the acquired defective region (Example 2);

(3) A case where the electron beam apparatus 70 of FIG. 1 is defined as of the image projection type with a plurality of electron beams (a multi-beam), and the electron beam is irradiated to a sample surface from an oblique direction relative thereto so as to perform a map inspection of a sample, an extraction of a defective region and a detailed observation of the image in the acquired defective region (Example 3);

(4) A case where the electron beam apparatus 70 of FIG. 1 is defined as of the image projection type with a multi-beam, and the electron beam is irradiated to a sample surface from an oblique direction relative thereto so as to perform an image inspection of a sample, an extraction of a defective region and a detailed observation by the SEM in the acquired defective region (Example 4); and (5) A case where the electron beam apparatus 70 of FIG. 1 is defined as of the image projection type with a multi-beam, and the electron beam is irradiated to a sample surface in the direction perpendicular thereto so as to perform simultaneously in real time an image inspection of a sample, an extraction of a defective region and a detailed observation by the SEM in the acquired defective region (Example 5).

EXAMPLE 1

Figure 7:
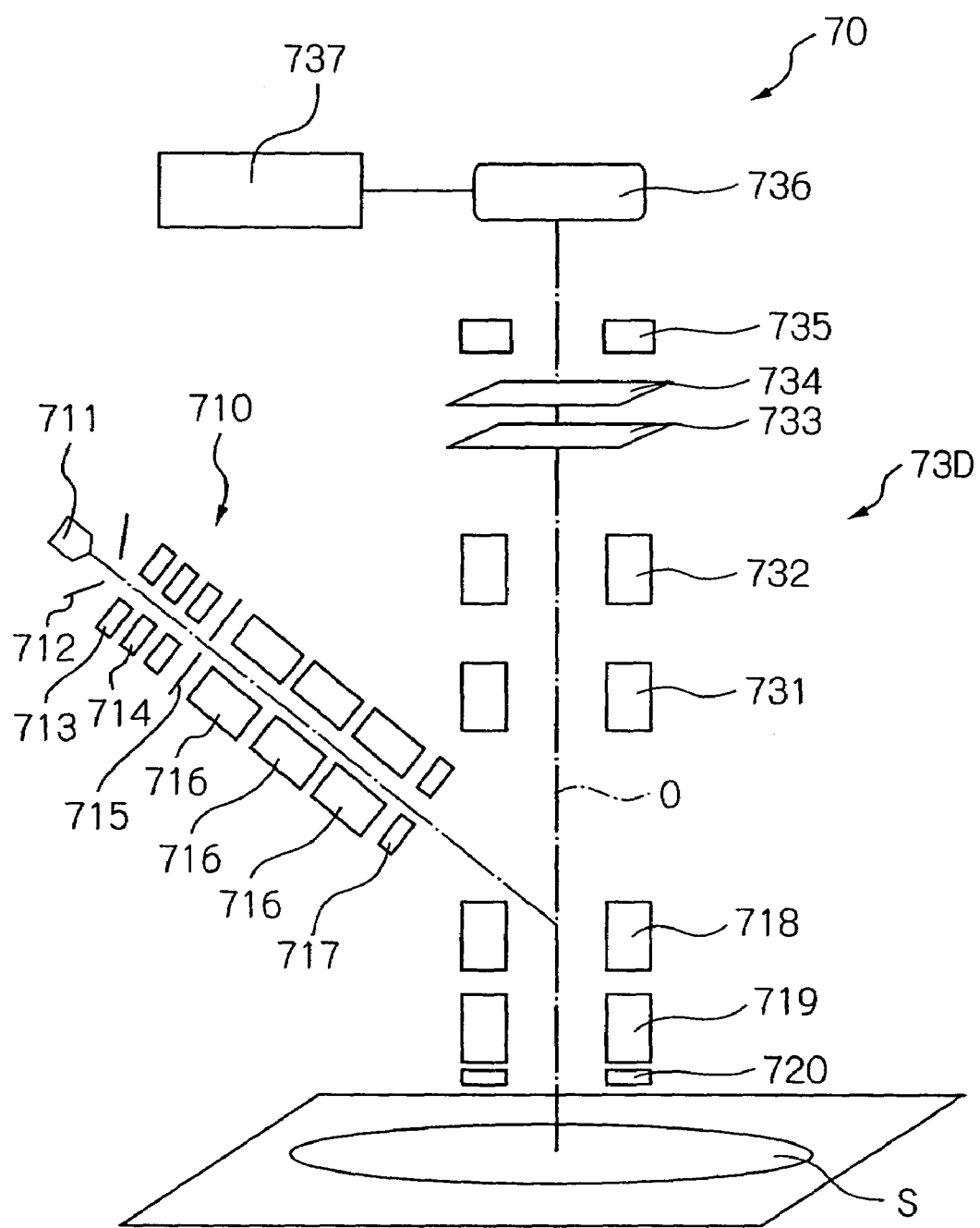
FIG. 7 is a diagram schematically illustrating an electron beam apparatus of image projection type with a single beam in example 1 of the present invention.

FIG. 7 schematically shows an electron beam apparatus 70 of image projection type with a single beam in example 1 of the electron beam apparatus 70 of FIG. 1. This electron beam apparatus 70 comprises a primary optical system 710 for shaping an electron ray emitted from an electron gun into a specified shape in section view and irradiating thus shaped electron beam onto a surface of a sample to be inspected, for example, a surface of a wafer S and a secondary optical system 730 for focusing secondary electrons emanating from the wafer S into an image on a detector.

The primary optical system 710 comprises a cathode 712 for drawing an electron ray from an electron source 711, an anode 713 for accelerating the electron ray (the electron source 711, the cathode 712 and the anode 713 together constructing an electron gun), an electrostatic lens 714, an aperture 715 for shaping the electron ray into an electron beam of specified shape in section view, a quadrupole lens 716 for converging the electron beam, and an aligner, each of which has a specified angle with respect to the direction perpendicular to the surface of the wafer and positioned in sequence with the electron gun placed on the top. The primary optical system 710 further comprises an E×B separator 718 for deflecting the electron beam, while separating the secondary electrons emanating from the wafer S, an objective lens 719 of electrostatic lens type and a control electrode 720, which are positioned sequentially along the direction perpendicular to the surface of the wafer S.

The control electrode 720 is made of a metallic disc having a thickness in a range of 1 mm to 2 mm and including a hole with a diameter of 2 mmφ formed in a center thereof, and disposed between the objective lens 719 and the wafer S at a location distant from the wafer S by 2 mm. For detecting the secondary electrons in the image projection method, the control electrode 720 is applied with a potential in a range of 0 V to +2 kV (or 0 V to 10 kV relative to the wafer potential) to thereby intensify an electric field between the wafer S and the control electrode 720, so that the secondary electrons from the wafer may be accelerated and thus the collection efficiency of the secondary electrons can be increased. In this example, the application of +2 kV can increase the collection efficiency of the secondary electrons as three times high as that with no control electrode. This efficiency also depends on a hole diameter of an aperture or a numerical aperture (NA, not shown). Further the electric field between the wafer S and the control electrode 720, if intensified, can help reduce the effect to the turbulence in the electric field on the wafer surface. For example, although a distortion is recognized in the pattern adjacent to a wafer edge, in which the electric field is widely varied, this distortion can be reduced equal to or under ⅕ by applying the potential of +2 kV to the control electrode 720. Further, as described in the term of "(3) the detailed defect image-taking condition setting", for the detection of reflected electrons, the optical power can be improved by two to three times (for example, for the optical magnification of 320, the improved optical magnification equivalent to or higher than 1000 can be obtained) by applying to the control electrode 720 a potential in a range equivalent to that of the wafer up to −4 kV therefrom (or 1 V to −1 kV relative to the wafer potential). In this case, since the electric field between the wafer S and the control electrode 720 is weakened (even lowered to 0), discharge can be controlled favorably to observe the wafer having a pattern otherwise apt to induce the discharge due to its larger insulating portion.

The secondary optical system 730 is arranged along the optical axis, O, of the secondary electrons from the wafer S, that have been separated by the E×B separator 718, extending in the direction perpendicular to the surface of the wafer, and the secondary optical system 730 comprises projection lenses 731, 732, a micro-channel plate (MCP) 733, a fluorescent screen 734, a relay lens 735, and a time-delay-integration (TDI) or a CCD camera 736 and an image processing unit 737. Each of the above-designated components may be a known component or unit, and a detailed description thereof is herein omitted.

A description will now be given of a method for performing a map inspection of a wafer, an extraction of a defective region and a detailed observation of the map in the acquired defective region. The electron beam to be irradiated onto the wafer may have a specified irradiation area, and the secondary electrons emanating from the wafer as a result of the irradiation of the electron beam have a specified emission area, as well. The irradiation area is substantially equal to the emission area, and their size and geometry can be changed. For example, the geometry may be circular, elliptical or rectangular in shape, wherein the elliptical shape may be defined by the ratio between minor and major axes approximately in a range of 1:1 to 1:6, and the rectangular shape may be also defined by the ratio approximately in a range of 1:1 to 1:6. Further, as for the size of the elliptical and rectangular shapes, the length of the minor axis may be in a range of 20 to 200 μm. accelerated at 4.5 keV, is transmitted through the electrostatic lens 714 and the aperture 715 to be shaped into an electron beam, which is in turn transmitted through the quadrupole electrode 716, the aligner 717, the E×B separator 718, the objective lens 719 and the control electrode 720, and finally is irradiated onto the wafer S with the incident energy of 500 eV and the beam illumination area of about 200 μmφ. The secondary electrons emanating from the wafer surface form an image on the MCP 733 in the magnification scale of 65 times with the aid of the objective lens 719 and the projection lenses 731, 732 in the secondary optical system 730. Subsequently, the detected electrons that have been projected in a larger scale by the MCP 33 are multiplied and converted into an optical signal in a fluorescent screen 734. The two-dimensional optical signal is guided via the relay lens 735 to the TDI or CCD camera 736, where it is converted into an electric signal. The pattern image data converted into the electric signal is stored in a memory on the image processing and displaying unit 737 to form an inspection image across an entire surface of the wafer. The TDI 736 can acquire the two-dimensional image signal while moving the wafer S continuously, and so allows for the image signal to be obtained at a high rate.

In the image processing unit 737, the extraction of the defective region of the wafer S and the detailed image observation in the acquired defective region may be carried out in accordance with the following manner based on the out in accordance with the following manner based on the inspection image across the entire surface of the wafer.

(1) Wafer Entire-Surface Inspection

Firstly, the electron beam is irradiated onto the wafer under a typical EO optical condition for the defect inspection, as defined by, for example, the incident energy of 500 eV (the accelerating voltage: −4.5 keV, the wafer potential: −4.0 keV), the total irradiation beam current of 1.6 μA, and the illumination area of 250 μmφ, and then the entire-surface inspection of the wafer of 200 μmφ is carried out for the throughput of one hour in the sequential image-taking with the TDI (the pixel resolution by the TDI is 0.1 μm) at the optical magnification scale of 160 in the image projection method and the stage unit speed of 15 mm/sec.

(2) Defect Coordinate Extraction

The TDI image is stored in the memory on the image processing and displaying unit 737 and processed in the defect extraction algorithm on the image processing and displaying unit 737 so that the defect extraction is executed from a differential image through the comparison between dies, such as die to be inspected and a reference die, or the comparison between cells (memory) defining a cyclic structure within the same die. Further, the data on the defect coordinates on the wafer is stored in the memory on the image processing and displaying unit 737 in a sequential manner in association with respective defect numbers. The list of the defect numbers and the coordinates (FIG. 13) are indicated on a monitor as well as the positions of defects (FIG. 14) on the wafer map.

(3) Detailed Defect Image-Taking Condition Setting

Then, the EO optical condition specifically for the detailed defect image-taking is set with the incident energy in a range of 500 to 1 keV (the accelerating voltage: −4.0 kev, the wafer potential: −3 to 3.5 keV), the total irradiation beam current of 1.6 μA, and the altered voltage condition in the quadrupole lens 716 so that the illumination area is changed from 250 μmφ to 30 μmφ so as to compensate for the S/N ratio for the observation in the higher magnification scale. Further, the control electrode 720 is set at −4.0 keV to eliminate the potential difference and thus define no electric field between the wafer and the control electrode 720 so as to perform an image-taking of the defects by using the CCD or TDI still of the image projection method having the optical magnification scale of 1000 and the pixel resolution of 20 nm, which are necessary for the defect image-taking.

(4) Detailed Defect Image Acquisition

From the point of view that it should take only about 0.5 sec to perform one defect image taken by the CCD image taken from the integration of 33 msec for 1 frame×16 times and the greater part of the time required for the detailed defect image acquisition is spent in moving the stage to the position of defect coordinate. The sequence in the inspection over the defect positions is changed in performing the observation in order to minimize the time required for moving the stage. The stage is moved to the defect coordinate positions sequentially based on the defect numbers and the defect data defined after the inspection sequence having been reorganized, and then the acquisition of the detailed defect images is sequentially performed under the image-taking condition as defined above in (3). Thus acquired detailed defect images can be displayed on the screen by designating the specific number on the defect list or listed on the defect list.

(5) Automatic Defect Classification (ADC)

Further, the detailed defect image is processed on the image processing and displaying unit 737 in accordance with the algorithm such as the ADC. For example, in the case of processing the defect images in the wiring process of the DRAM and the like, specifically the defect images in the short-circuit between wirings, the open-circuit (i.e., disconnection) in the wirings or those in the via hole process, where the defects are classified into abnormal category, and the data indicative of the frequency of occurrence is graphically presented in the image processing and displaying unit 737. Based on those sets of data, the feedback is given to the exposing, etching and film-depositing conditions in the wafer manufacturing process, and further the particle production can be suppressed by specifying the particle production environment and the location thereof. In this way, the yield in the wafer manufacturing process can be improved.

EXAMPLE 2

Figure 8:
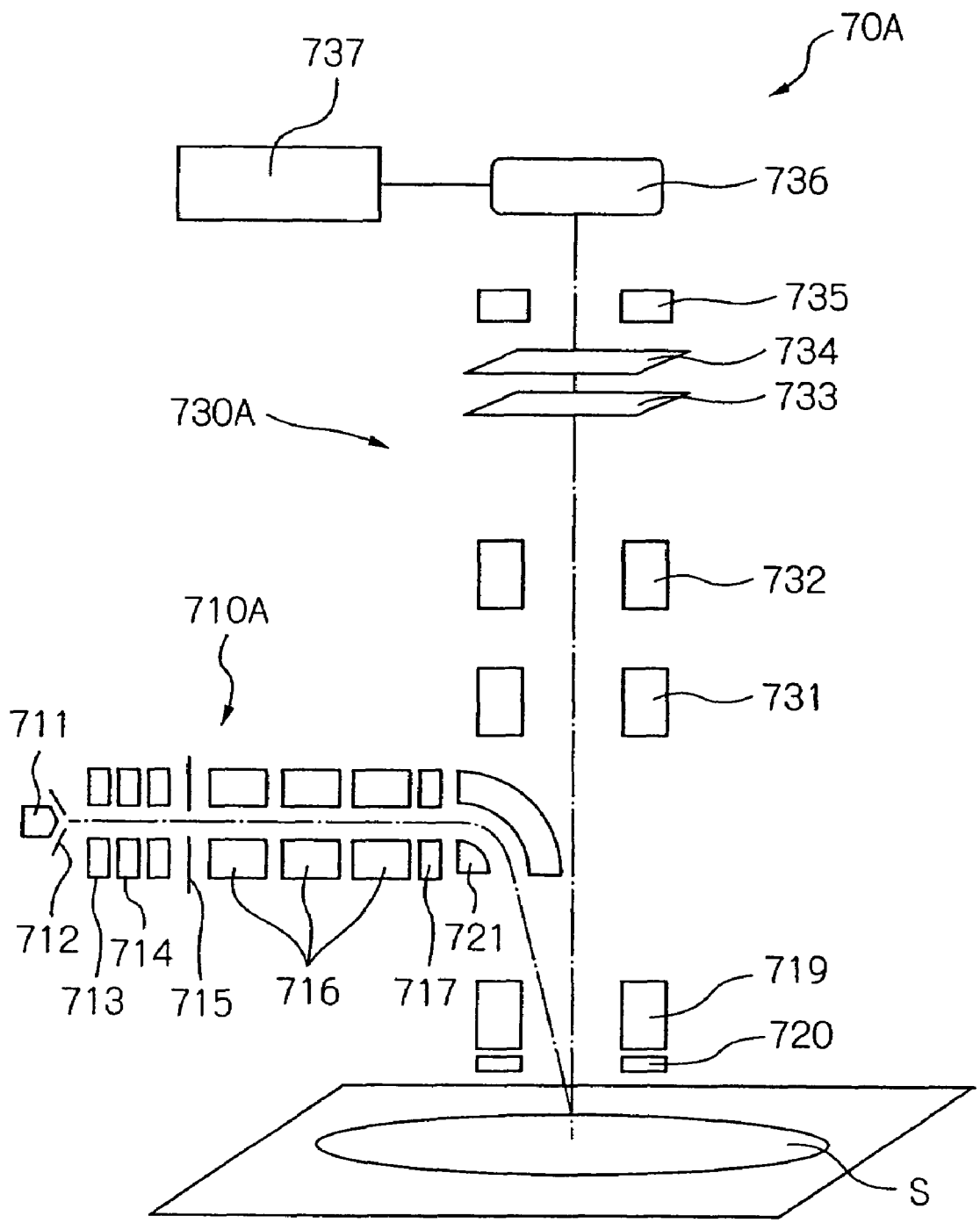
FIG. 8 is a diagram schematically illustrating an electron beam apparatus of image projection type with a single beam in example 2 of the present invention.

FIG. 8 schematically shows an electron beam apparatus 70A of image projection type with a single beam in example 2 of the electron beam apparatus 70 of FIG. 1. This electron beam apparatus 70A has the same configuration as the electron beam apparatus in example 1 (FIG. 7), with the exceptions that a primary optical system 710A is arranged in parallel correspondence to the wafer and provided with a sector deflector 721 and that a secondary optical system 730A includes no E×B separator. In the present example, to irradiate the electron beam to a sample surface from the oblique direction relative thereto, firstly the electron beam is guided in a direction parallel to the wafer, and after passing through the aligner 717, the electron beam is controlled by the sector deflector 721 to irradiate from the oblique direction.

The manner of executing the image inspection of the wafer, the extraction of the defective region and the detailed image observation in the acquired defective region, respectively, is the same as in example 1.

EXAMPLE 3

Figure 9:
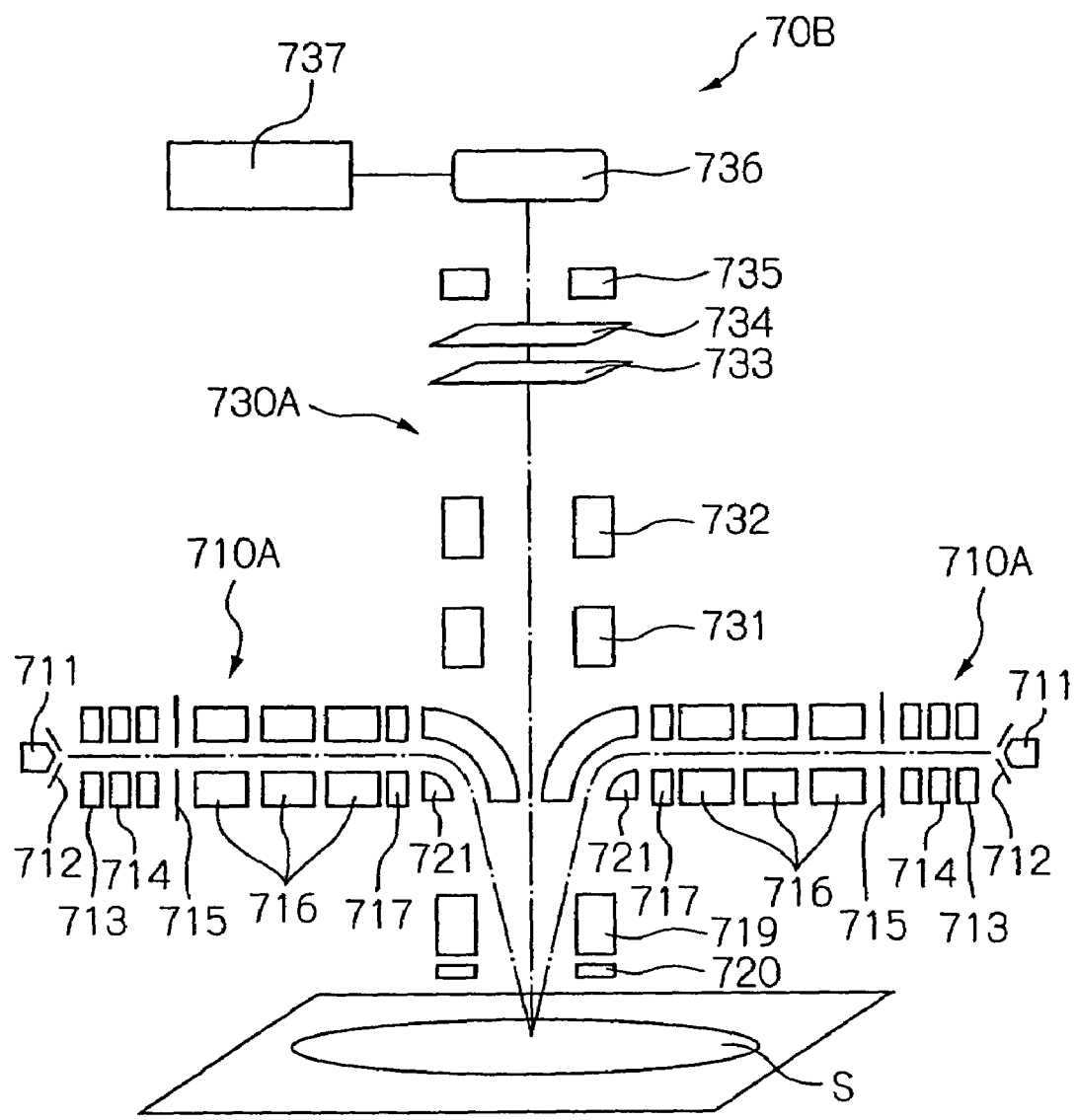
FIG. 9 is a diagram schematically illustrating an electron beam apparatus of image projection type with a multi-beam in example 3 of the present invention.

FIG. 9 schematically shows an electron beam apparatus 70B of image projection type with a multi-beam in example 3 of the electron beam apparatus 70 of FIG. 1. This electron beam apparatus 70B has the same configuration as the electron beam apparatus 70A in example 2, with the exception that the electron beam apparatus 70B comprises a plurality of primary optical systems 710A. Since this electron beam apparatus 70B allows for a plurality of electron beams to be irradiated on the wafer, for the observation in the low reflected electron mode defining a lower emission ratio of the electrons from the wafer, some of the total number of electron beams (e.g., three of four electron beams) may be concurrently irradiated to the same inspection region to thereby improve the S/N ratio. Further, for the case of the detailed observation to be subsequently executed, the optical condition for the rest of the electron beams (i.e., the remaining one beam of the four electron beams) may be limited to the application to the purpose of the detailed observation, or it may be set to the optical condition for the no-electric field reflected electron mode (higher magnification) in advance (i.e., setting with the beam illumination area in the primary optical system of 30 $\mu m\phi$, the accelerating voltage of 4 kV, the wafer potential of −3 to 3.5 kV and the driving-back potential in the control electrode 720 of −4 kV) so that the time required for setting the optical condition can be reduced.

The manner of executing the image inspection of the wafer, the extraction of the defective region and the detailed image observation in the acquired defective region, respectively, is the same as in examples 1 and 2.

Figure 10:
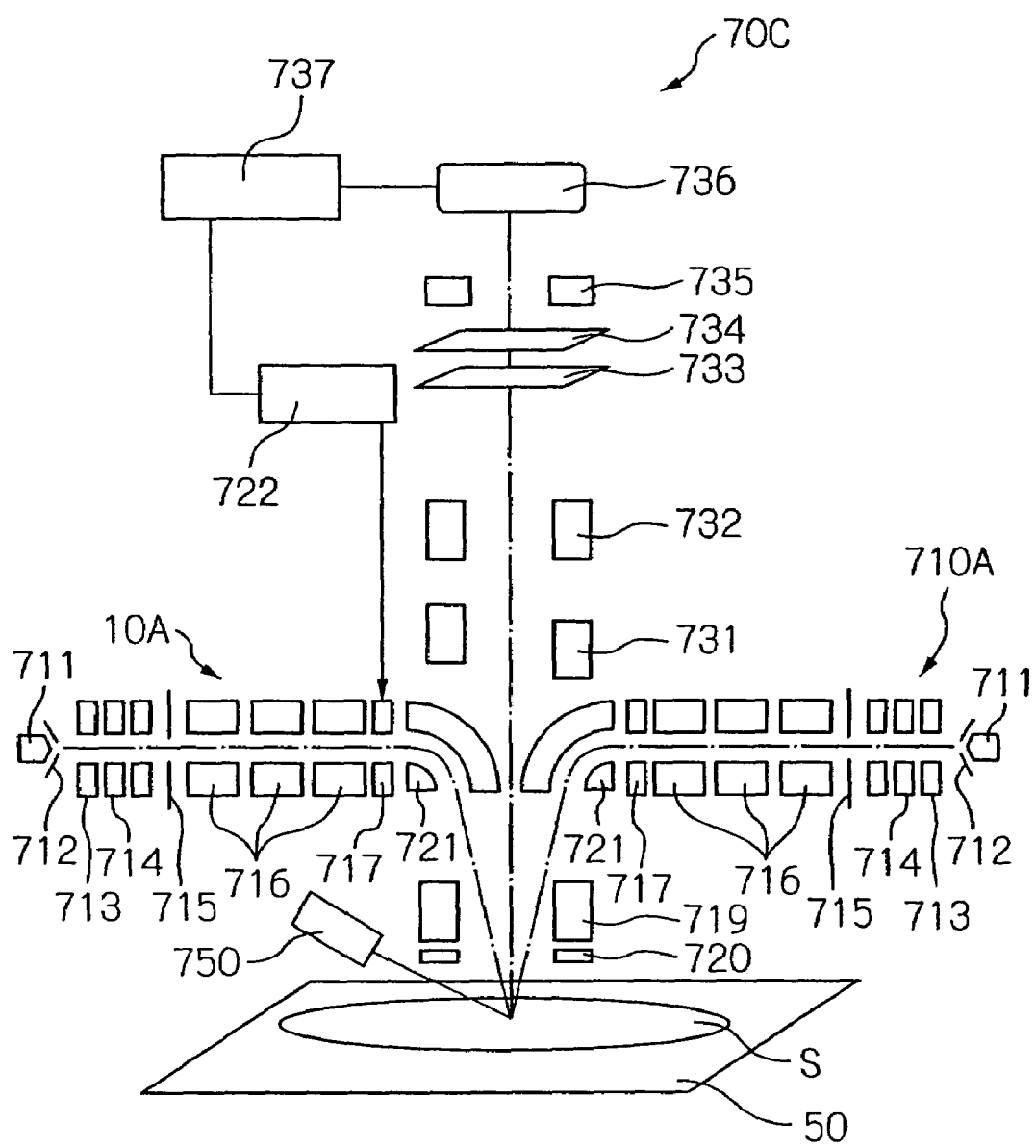
FIG. 10 is a diagram schematically illustrating an electron beam apparatus of image projection type with a multi-beam in example 4 of the present invention.

FIG. 10 schematically shows an electron beam apparatus 70C of image projection type with a multi-beam in example 4 of the electron beam apparatus 70 of FIG. 1. Although this electron beam apparatus 70C is similarly configured to the electron beam apparatus 70B of example 3, it further comprises a photo multiplier or a line sensor 750 arranged in the vicinity of the electron beam irradiating position and proximal to the wafer S. This photo multiplier 750 detects the secondary electrons and forms the SEM image. The electron beam apparatus 70C is further provided with a control power supply 722 for the aligner 717.

The manner of executing the image inspection of the wafer, the extraction of the defective region and the detailed image observation in the acquired defective region, respectively, will be now described. In the illustrated example, the image representative of the entire surface of the wafer is formed in the image projection method with some of the total number of electron beams in the primary optical system, and the detailed observation on the defective region is performed in the SEM method with the rest of the electron beams. Accordingly, the focal condition for the quadrupole lens 716 or the like is previously adjusted in such a way that respective electron beams in the primary optical system may form spots on the wafer.

(1) Firstly, the image representative of the entire surface of the wafer is formed in the image projection method by using the TDI 736 while continuously moving a stage unit 50 at the rate of 15 mm/sec. During this operation, some of the electron beams are irradiated concurrently to the same inspection region, and this can improve the S/N ratio.

(2) Secondly, based on thus obtained image representative of the entire surface of the wafer, the defect inspection program within the image processing unit 737 executes the cell-to-cell comparison or the image comparison for each die so as to extract the position coordinate of the defect.

(3) After the extraction, the image processing unit 737 signals to the control power supply 722 for the aligner 717 to move the rest of the electron beams (spot diameter of 10 nm$\phi$) to the region corresponding to the position coordinate of the defect.

Figure 11:
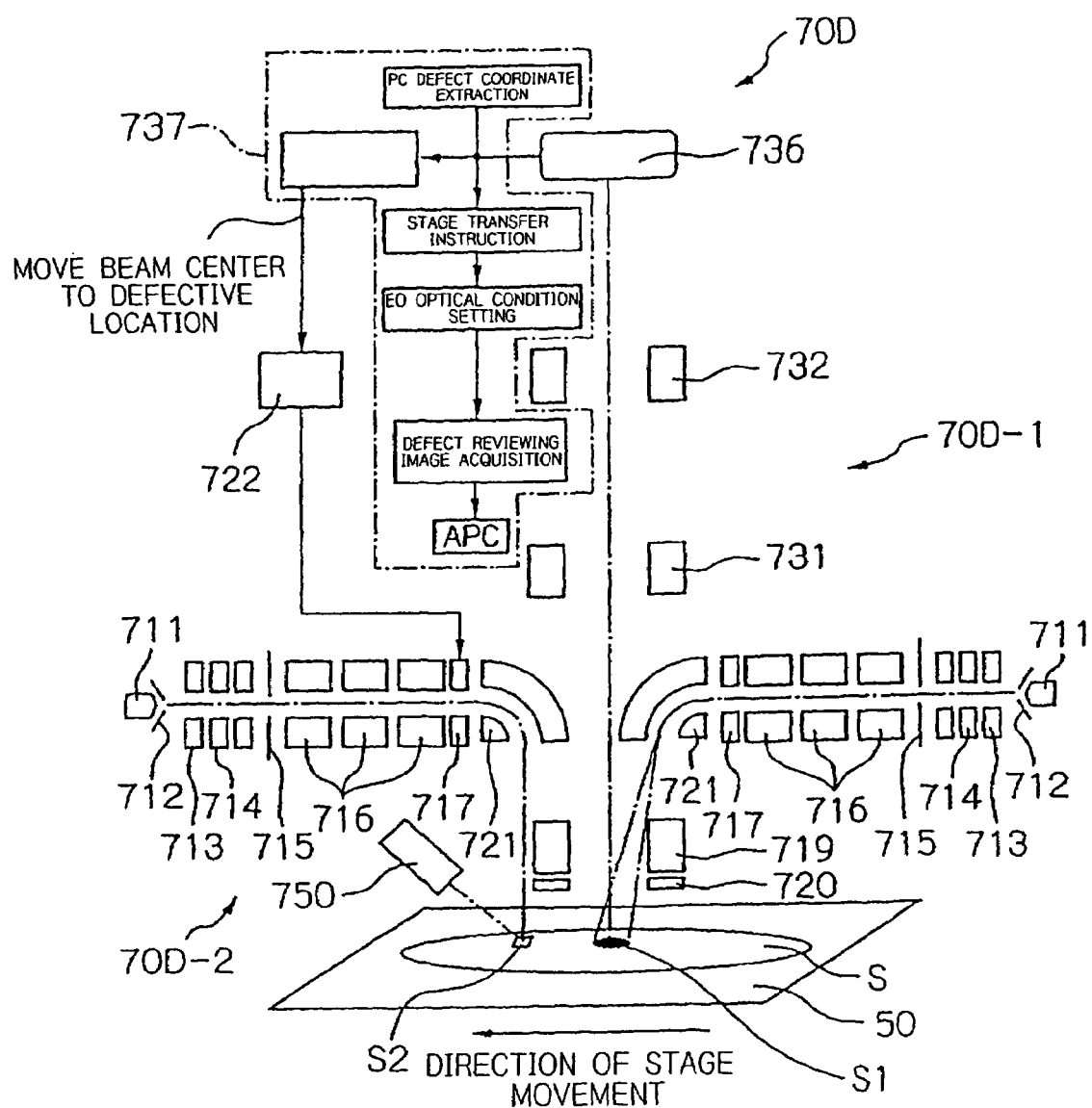
FIG. 11 is a diagram schematically illustrating an electron beam apparatus of image projection type with a multi-beam in example 5 of the present invention.

(4) The irradiation and the scanning operations are further performed while moving the rest of the electron beams so as to keep pace with the stage moving rate (see FIG. 11). The secondary electrons emanating from the irradiated area are detected by the photo multiplier (or the line sensor) 750 and thereby the SEM image is formed. A detailed observation is performed in the defective region on the wafer based on the SEM image.

EXAMPLE 5

FIG. 11 schematically shows an electron beam apparatus 70D of image projection type with a multi-beam in example 5 of the electron beam apparatus of FIG. 1. In this electron beam apparatus 70D, one of the plurality of optical systems is an optical system of image projection type 70D-l, and the other of the plurality of optical systems is an optical system of SEM type 70D-2 provided separately from the optical system of image projection type 70D-1. The image inspection across the entire surface of the wafer and the extraction of the defective region are executed by the optical system of image projection type 70D-1, while concurrently the detailed observation in the acquired defective region is executed by the independent optical system of SEM type 70D-2. Therefore, the image inspection across the entire surface of the wafer, the extraction of the defective region and the detailed observation in the defective region can be performed in parallel correspondence yet in real time. Although the optical system of image projection type 70D-1 is similarly configured to the electron beam apparatus 70C in example 4, it is not provided with the MCP, the fluorescent screen and the relay lens. Further, the optical system of SEM type 70D-2 is operable similarly to example 4.

Figure 12:
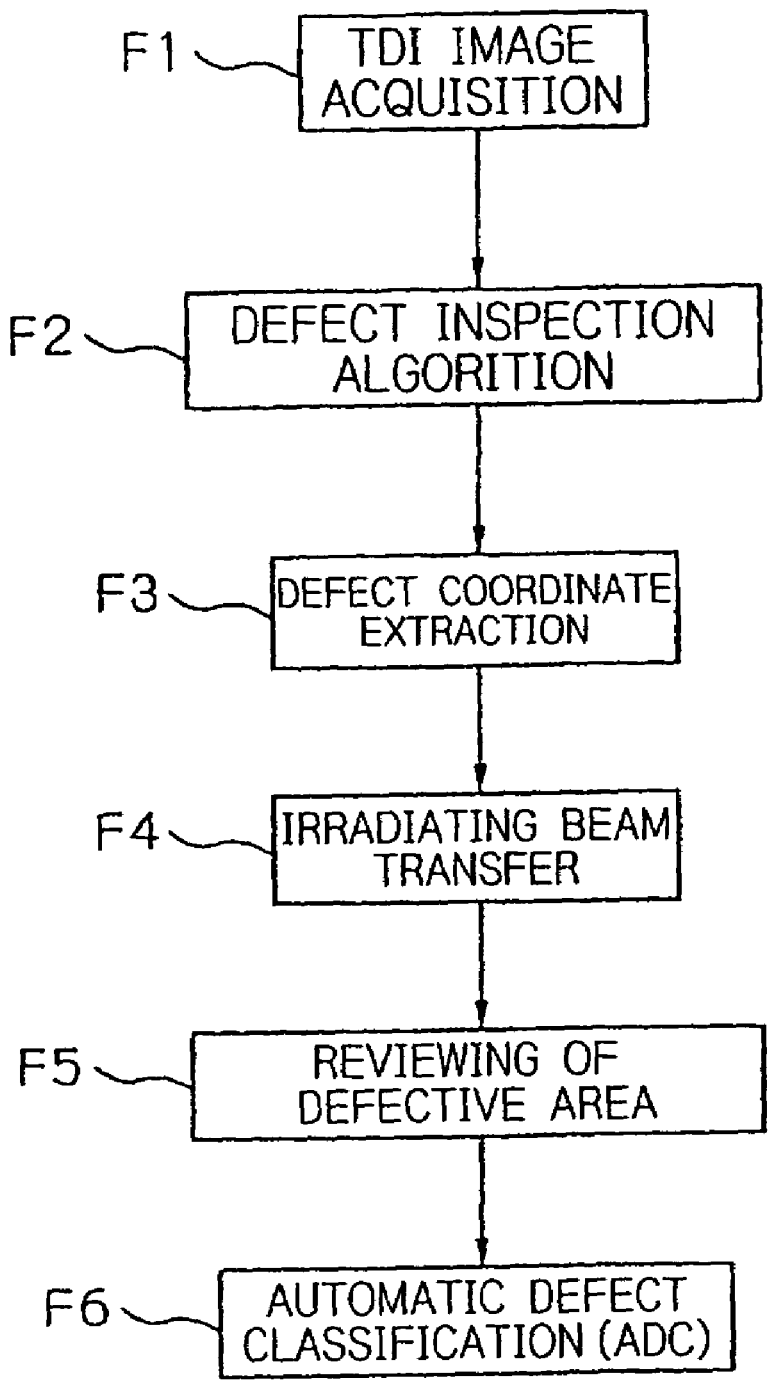
FIG. 12 is a flow chart for performing a map inspection of a wafer, an extraction of a defective region and a detailed observation in the acquired defective region.
Figure 14:
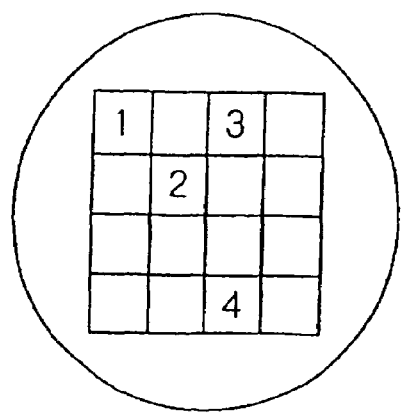
FIG. 14 shows a defect map on a wafer.

FIG. 12 shows a flow chart for executing the image inspection of the wafer, the extraction of the defective region and the detailed observation in the acquired defective region. In the electron beam apparatus 70D of the illustrated example, the formation of the image representative of the entire surface of the wafer is performed by using the optical system of image projection type 70D-1 and the detailed observation of the defective region is performed by using the separate optical system of SEM type 70D-2.

(1) Firstly, a specified illumination area, S1, is irradiated with the optical system of image projection type 70D-1 while moving continuously the stage unit 50, and the image representative of the entire surface of the wafer is formed in the image projection method by using the TDI 736. . . . F1

(2) Secondly, the cell-to-cell comparison or the image comparison for each die is performed based on thus obtained image of the entire surface of the wafer in accordance with the defect inspection algorithm within the image processing unit 737 so as to extract the position coordinate of the defect. . . . F2, F3

(3) After the extraction, the image processing unit 737 signals to the control power supply 722 for the aligner to move the optical system of SEM type 70D-2 onto an area, S2, corresponding to the position coordinate of the defect. . . . . F4

(4) The irradiation and the scanning operations for the area S2 corresponding to the position coordinate of the defect are further performed while moving the optical system of SEM type 70D-2 to keep pace with the stage moving rate. The secondary electrons emanating from the irradiated area S2 are detected by the photo multiplier 750, and thereby the SEM image is formed. . . . F5

(5) The detailed observation is applied to the SEM image, and the automatic defect classification into categories, such as open-, short- or artificial circuit, is executed to provide the feedback, such as failure analysis, to the wafer manufacturing process. . . . F6

In this way, the inspection of the entire surface of the wafer and the detailed observation in the defective region can be processed in parallel correspondence and in real time. Therefore, the inspection time can be significantly reduced.

3. A Manufacturing Method of Semiconductor Device

Figure 15:
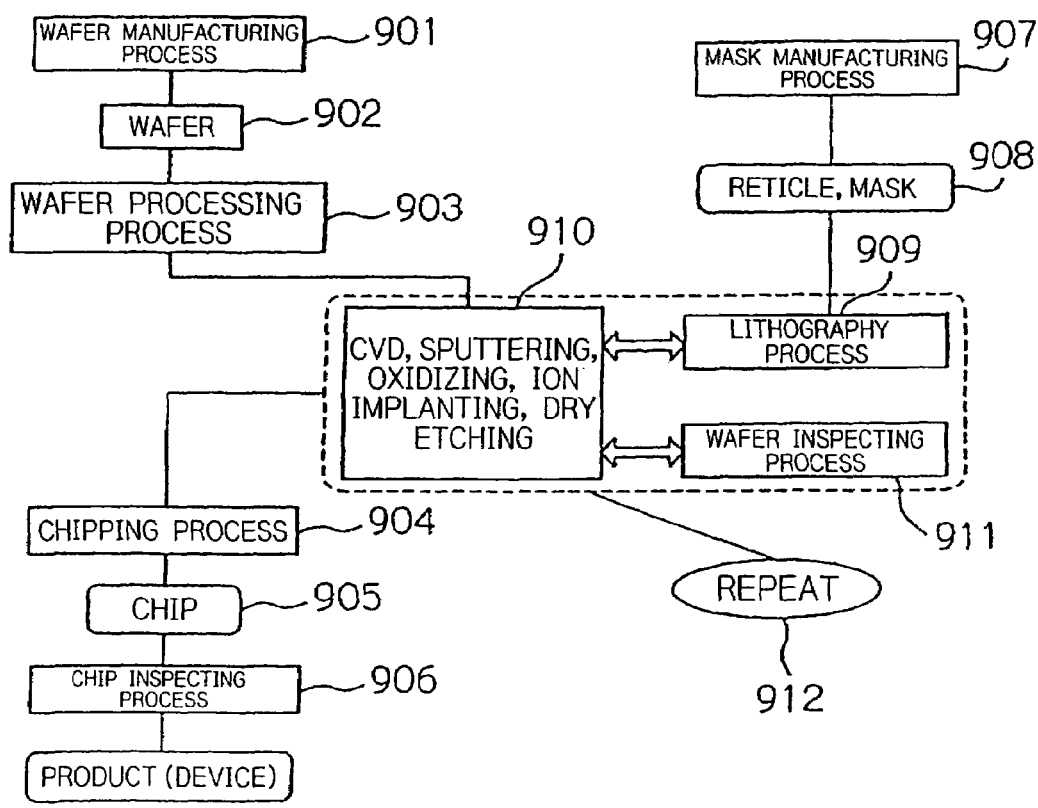
FIG. 15 is a flow chart illustrating a device manufacturing process.
Figure 16:
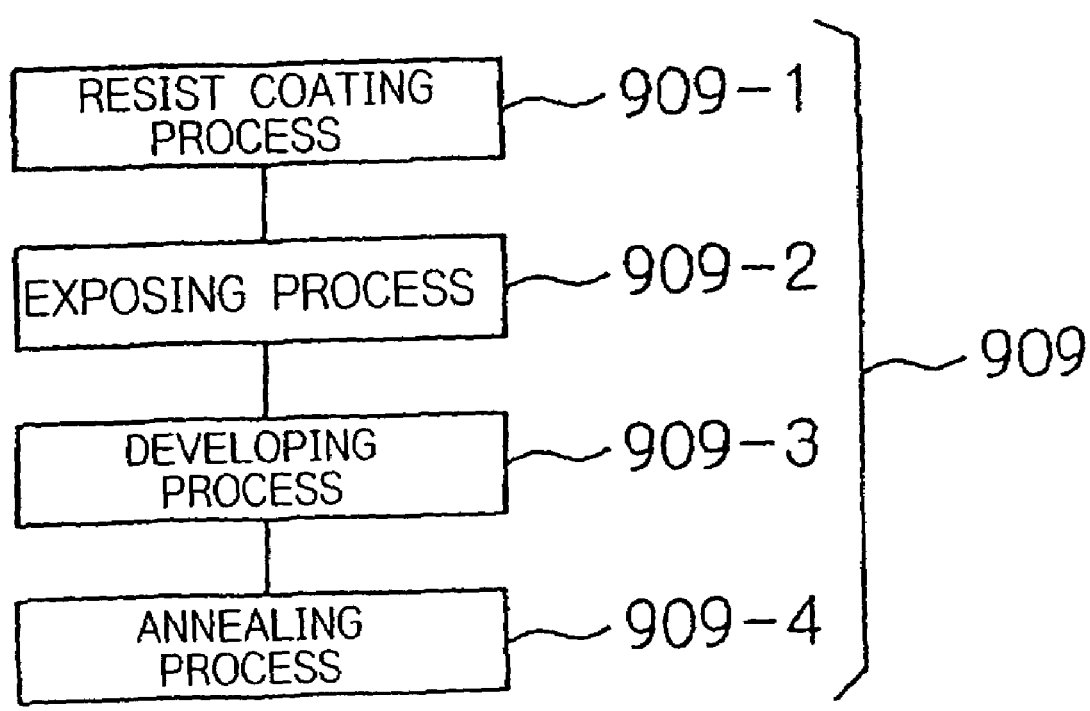
FIG. 16 is a flow chart illustrating a lithography process.

Referring now to FIGS. 15 and 16, a manufacturing method of a semiconductor device according to the present invention will be described. FIG. 15 is a flow chart showing one embodiment of the manufacturing method of semiconductor device according to the present invention. The process in this embodiment includes the following main processes:

(1) A wafer manufacturing process for fabricating a wafer (or wafer preparing process for preparing a wafer) . . . 901

(2) A mask manufacturing process for fabricating a mask to be used in the exposure (or a mask preparing process for preparing a mask) . . . 907, 908

(3) A wafer processing process for performing any processing treatments necessary for the wafer . . . 903

(4) A chip assembling process for cutting out those chips formed on the wafer one by one to make them operative . . . 904, 905

(5) A chip inspection process for inspecting the manufactured chip . . . 906

It is to be noted that each of those main processes further comprises several sub-processes.

Among those main processes, one that gives a critical affection to the performance of the semiconductor device is (3) the wafer processing process. In this wafer processing process, the designed circuit patterns are deposited on the wafer one on top of another, thus to form many chips, which will function as memories or MPUs. This wafer processing process includes the following sub-processes.

(1) A thin film deposition process for forming a dielectric thin film to be used as an insulation layer, a metallic thin film to be formed into a wiring section or an electrode section, and the like (by using the CVD or the sputtering process) . . . 910

(2) An oxidizing process for oxidizing those thin film layers and the wafer substrate . . . 910

(3) A lithography process for forming a resist pattern by using a mask (reticle) in order to selectively process the thin film layers and/or the wafer substrate . . . 909

(4) An etching process for processing the thin film layers and/or the wafer substrate in conformity with the resist pattern (by using, for example, dry etching technology) . . . 910

(5) An ions/impurities implant and diffusion process . . . 910

(6) A resist stripping process . . . 910

(7) An inspection process for inspecting the processed wafer . . . 911

It is to be noted that the wafer processing process must be performed repeatedly as desired depending on the number of layers contained in the wafer (912), thus to manufacture the semiconductor device that will be able to operate as designed.

FIG. 16 is a flow chart showing the lithography process (909) included as a core process in said wafer processing process. The lithography process comprises the respective processes as described below.

(1) A resist coating process for coating the wafer having a circuit pattern formed thereon in the preceding stage with the resist . . . 909-1

(2) An exposing process for exposing the resist . . . 909-2

(3) A developing process for developing the exposed resist to obtain the pattern of the resist, . . . 909-3

(4) An annealing process for stabilizing the developed resist pattern . . . 909-4

All of the semiconductor device manufacturing process, the wafer processing process and the lithography process described above are well-known, and so any further description should not be necessary.

When a defect inspection method and an electron beam apparatus according to the present invention are used in the above-described inspection process of (7), any defects can be detected with high throughput even on a semiconductor device having a fine pattern, enabling 100-percent inspection and thus improvement in yield of the products as well as the avoidance of shipping of any defective products.

4. Inspection Procedure in the Inspection Process

Figure 17:
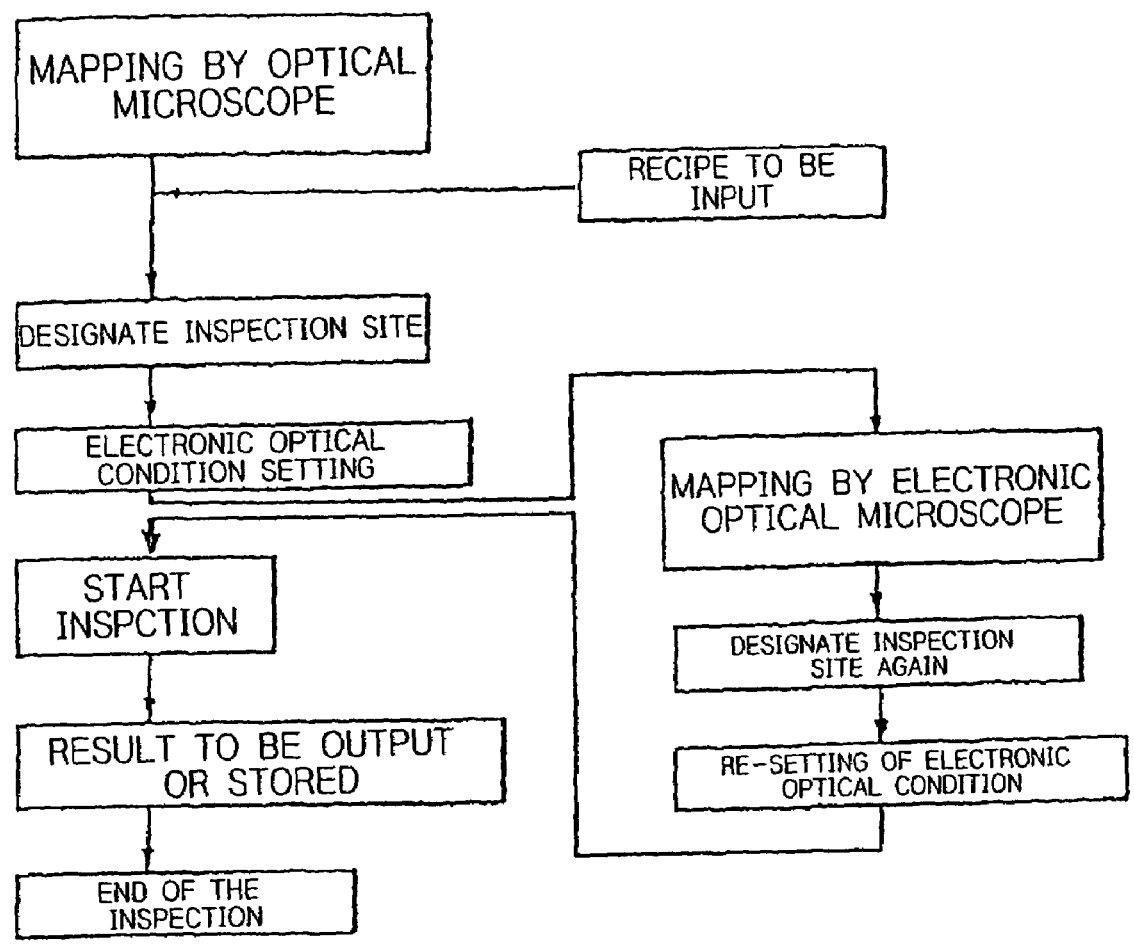
FIG. 17 is a chart illustrating an inspection procedure in a semiconductor device manufacturing method according to the present invention.

An inspection procedure in the inspection process designated above in (7) will now be described with reference to FIG. 17.

4-1. Inspection

From the reason that a defect inspection apparatus using an electron ray is typically expensive and its throughput is relatively low as compared to other processing apparatuses, such a defect inspection apparatus is used, in the current circumstances, after a critical process which is considered to be followed by the inspection (e.g., etching, film deposition or CMP (Chemical and Mechanical Polishing) planarization process), and it is also applied to the wiring process, specifically to a very fine wiring process including Step 1 and Step 2 in the wiring process, and to a gate wiring process prior to said very fine wiring process. It is particularly important to find and locate a geometric defect and/or an electric defect in the wirings having their line width equal to or narrower than 100 nm and/or in the via holes having their diameter equal to or smaller than 100 nm, which are designed under the design rule of 100 nm or less, and to provide the feedback to the manufacturing process.

A wafer to be inspected is transferred by an atmospheric transfer system and a vacuum transfer system, aligned with an X-Y stage unit of ultra-high precision and securely held thereon by an electrostatic chuck mechanism and the like, and as it is, the wafer is subsequently applied with the defect inspection and the like in accordance with the procedure (shown in FIG. 17). Firstly, if desired, the optical microscope is used to confirm the positions of respective dies and/or to detect the height of respective positions, and then thus obtained data are stored. The optical microscope may be used also to acquire an optical microscopic image of an area desired to be viewed, such as a defective area, which may be used in the comparison to the electron beam image. Secondly, the condition setting for the electronic optical system is performed, and the electron beam image is used to modify the information set by the optical microscope and thus improve the precision. Then, the procedure executes the input operation of the information contained in the recipe corresponding to the type of the wafer (for example, wafer after which process, wafer size of 200 mm or 300 mm) to the apparatus, which is followed by the specifying of the inspection site, setting of the electronic optical system, and setting of the inspection condition, and then lastly executes the defect inspection typically in real time while taking the image. The inspection including a cell-to-cell comparison or a die comparison, for example, is executed by the high-speed information processing system containing the algorithm, and the result may be output to the CRT or the like and/or stored in the memory, as required.

4-2. Inspection Method 4-2-1 Overview

Figure 18:
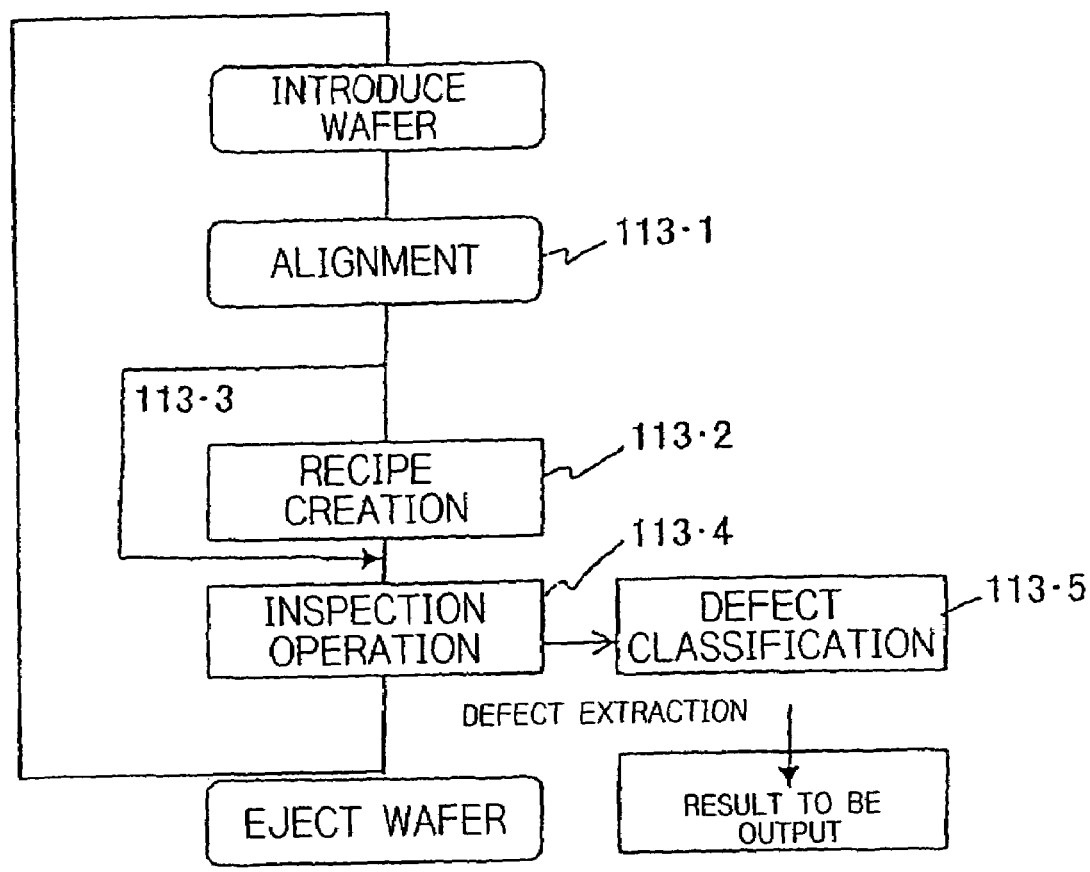
FIG. 18 is a chart illustrating a basic flow of the inspection procedure in the semiconductor device manufacturing method according to the present invention.

A basic flow of the inspection is shown in FIG. 18. After the transfer operation of wafer including the alignment operation 113·1, firstly s recipe containing the set conditions involving in the inspection is created (113·2). At least one type of recipe is necessary for the wafer to be inspected, and a plurality of recipes may be prepared for a single wafer to be inspected in order to cope with many different inspection conditions. Further, when there is a plurality of wafers to be inspected, all having the same pattern, only one type of recipe may be used to inspect all of those wafers. The path 113·3 of FIG. 18 indicates that the creation of a new recipe is not required immediately before the inspection operation if the previously created recipe is available for the current inspection.

In FIG. 18, the inspection operation 113·4 executes the inspection of the wafer in the following manner in accordance with the conditions and sequence specified in the recipe. The defect extraction is instantly executed each time the defect is found during the inspection operation, in which the following operations are executed substantially in parallel correspondence:

a) the operation of executing the defect classification (113·5) and adding the extracted defect information and the defect classification information to a result output file;

b) the operation of adding an extracted defect image to a result output file dedicated for image, or a file; and c) the operation of indicating the defect information, including the position of the extracted defect, on the operation screen.

After the inspection having been completed for each wafer to be inspected, the following operations are executed substantially in parallel correspondence:

a) the operation of closing and saving the result output file;

b) the operation of forwarding the inspection result, if the inspection result is requested via external communication; and c) the operation of ejecting the wafer.

If the setting instructs to execute the inspection of the wafers in a serial manner, the subsequent wafer to be inspected is transferred into a position, to which a series of operations as specified above is repeated.

A detailed explanation will now be given of the flow of FIG. 18.

(1) Creation of Recipe

The recipe refers to a setting file for describing the conditions involved in the inspection and may be possibly stored. The setting in the apparatus is carried out by using the recipe during or before the inspection, wherein the conditions involving the inspection described in the recipe include:

(2) a) a die to be inspected;

b) an area to be inspected within a die;

c) an inspection algorithm;

d) a detection condition (a condition required in the defect extraction, including inspection sensibility, for example); and e) an observation condition (a condition required in the observation, including a magnification scale, a lens voltage, a stage unit speed and an inspection sequence, for example). The c) inspection algorithm in the specific text will be described later.

Figure 19:
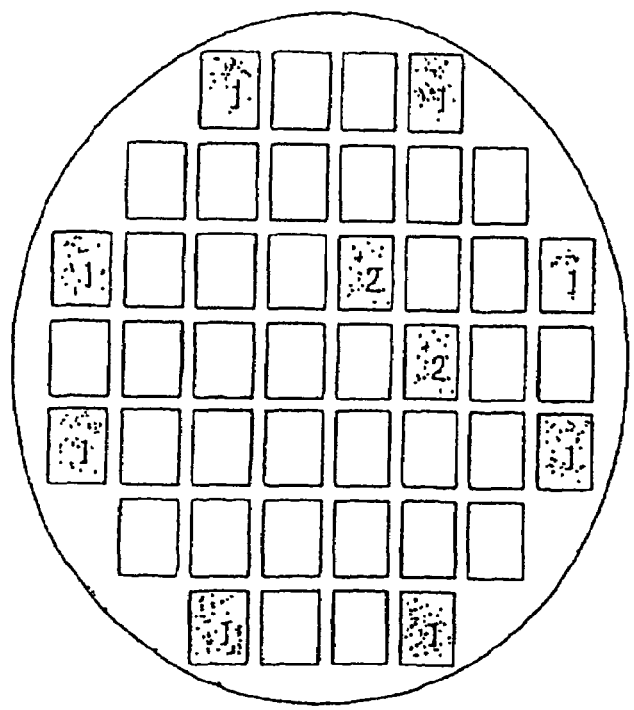
FIG. 19 shows setting of a die to be inspected.

(3) Among those listed above, the setting of the die to be inspected is executed by an operator who designates the die to be inspected on the die mapping screen presented in the operation screen as shown in FIG. 19. In the example shown in FIG. 19, the dies 1 located in a periphery of the wafer and the dies 2 that have been determined obviously defective in the previous step are grayed out in order to delete from the group of inspection subjects, with the rest assigned as the dies to be inspected. The system also has a function for automatically designating the die to be inspected based on the distance from the wafer edge and/or the good-or-bad information on the die that has been detected in the previous step.

Figure 20:
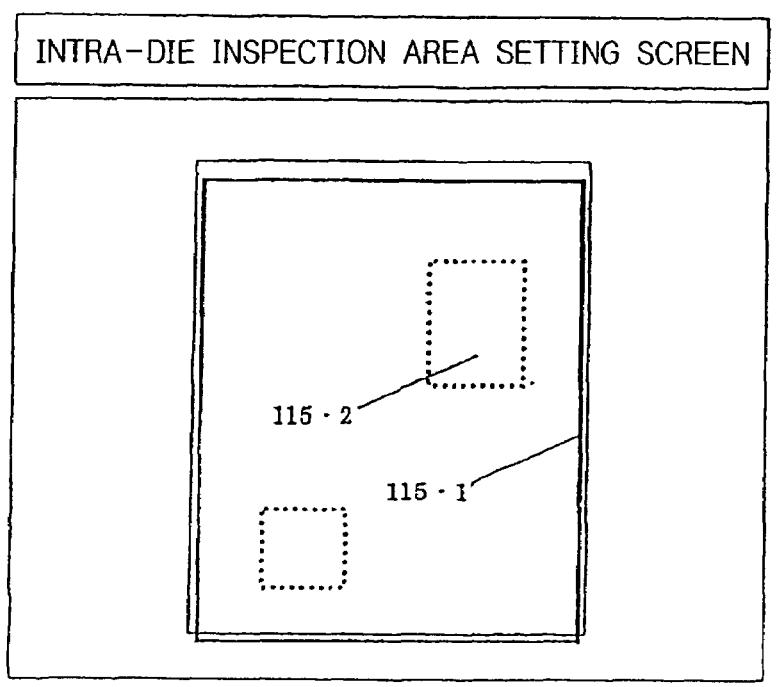
FIG. 20 shows setting of a region to be inspected within a die.

To set the area to be inspected within the die, the operator designates the area to be inspected by an input device such as a mouse based on the image acquired by the optical microscope or the EB microscope on the intra-die inspection area setting screen indicated in the operation screen, as shown in FIG. 20. The example shown in FIG. 20 designates the area 115·1 indicated by the solid line and the area 115·2 indicated by the dotted line.

The area 115·1 encompasses substantially the entire area of a die as the designated area. The inspection algorithm employs the adjacent die comparison method (i.e., Die-Die inspection), and separately specifies any details of the inspection condition and the observation condition with respect to this area. In the area 115·2, the inspection algorithm employs the array inspection (cell inspection), and separately specifies any details of the inspection condition and the observation condition with respect to this area. That is, a plurality of inspection areas can be designated, and the unique condition setting for the inspection algorithm and/or the inspection sensibility can be applied to respective designated inspection areas. Further, the areas to be inspected can be overlapped, and also the different sets of inspection algorithm can be concurrently operated on the same area.

(4) Inspection Operation

Figure 21:
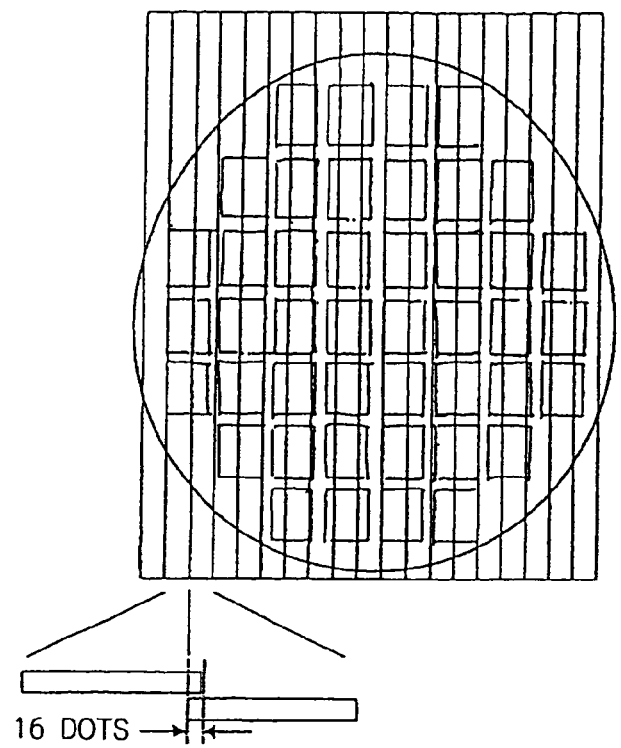
FIG. 21 is a diagram illustrating an inspection procedure in the semiconductor device manufacturing method according to the present invention.

In the inspection, the surface of the wafer to be inspected is segmented and scanned by a scanning width as shown in FIG. 21. The scanning width is determined generally based on the length of the line sensor, in which it is set such that the end portions of the line sensor may be overlapped by a short distance. This is for the purpose of determining the continuity between lines in the final and integrated processing of the detected defect(s) and/or securing some room for making image alignment in the execution of the comparative inspection. The amount of overlapping may be about 16 dots for the line sensor of 2048 dots.

Figure 22:
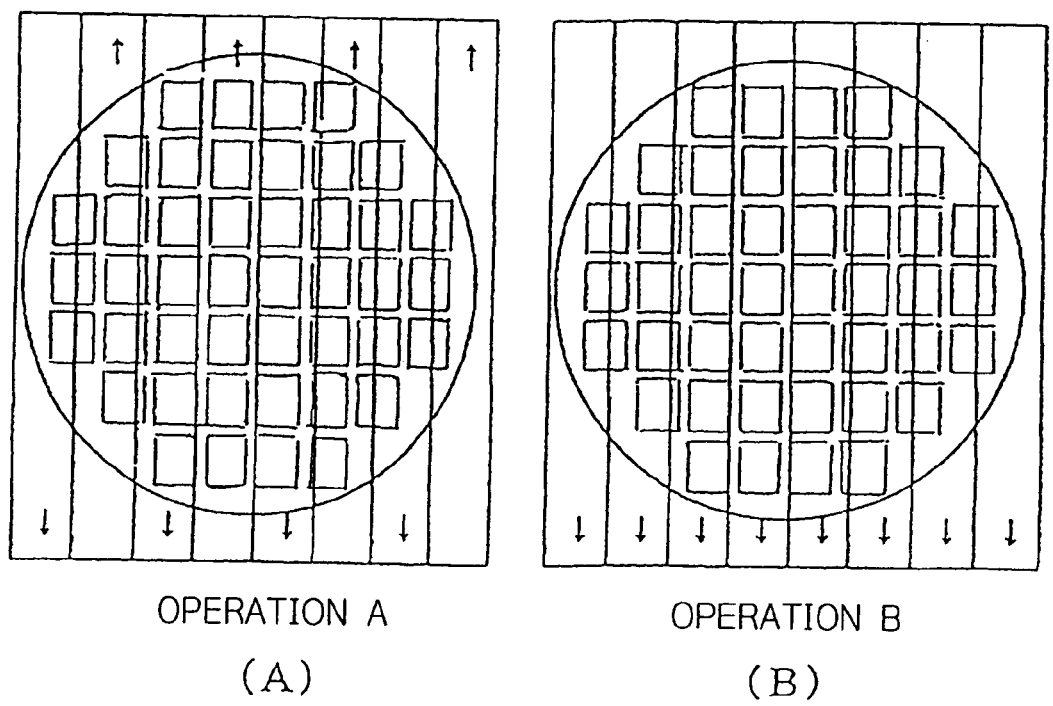
FIG. 22(A) and FIG. 22(B) illustrate the inspection procedure in the semiconductor device manufacturing method according to the present invention, respectively.

The scanning direction and sequence are shown schematically in FIG. 22. It indicates that the present invention provides the operator with the selection of operation, in which the operator may select the bi-directional operation A to reduce the inspection time or the uni-directional operation B due to mechanical restrictions.

Figure 23:
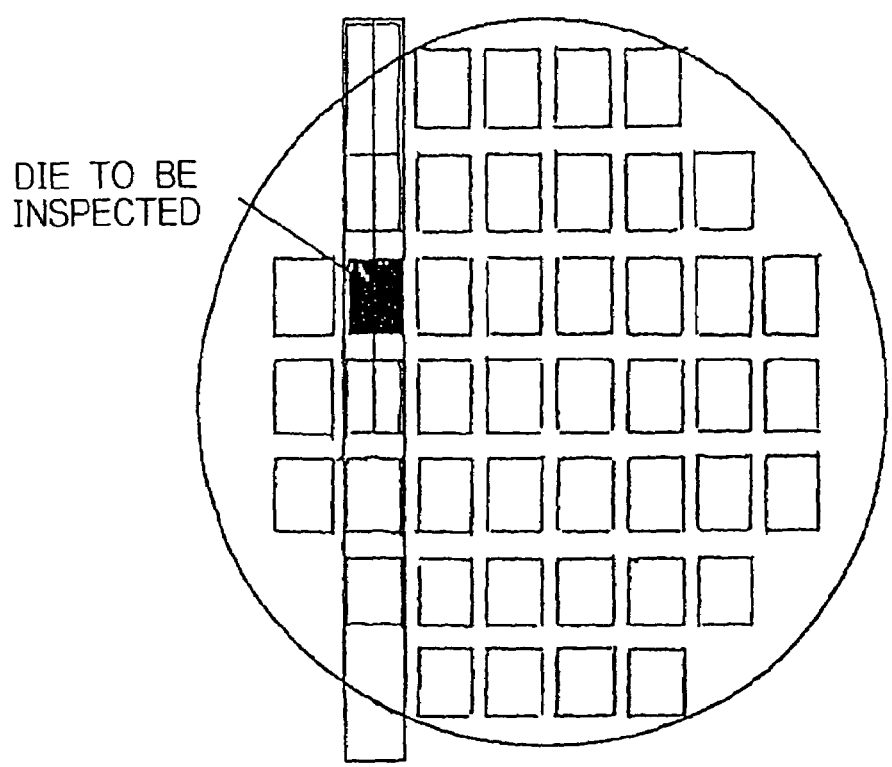
FIG. 23 illustrates an example of a scanning operation in a case of only one die to be inspected in the inspection procedure in the semiconductor device manufacturing method according to the present invention.

The Inspection method of the present invention further includes a function for automatically executing an arithmetic operation to determine the operation for reducing the scanning volume based on the setting in the recipe for the die to be inspected and accordingly executing the inspection. FIG. 23 shows an example of the scanning for the case of a single die to be inspected, eliminating any unnecessary scanning.

4-2-2 Inspection Algorithm

The algorithm used in the inspection executed in the present apparatus includes two major types in general classification:
1. Array inspection (cell inspection); and
2. Random inspection (die inspection).

The random inspection is further classified as follows, depending on the subject to be compared:
a) Adjacent die comparison method (Die-Die inspection);
b) Master die comparison method (Die-Any Die inspection); and
c) CAD data comparison method (Cad Data-Any Die inspection).

The method referred to as the golden template method generally represents said b) and c), wherein the master die is taken as the golden template in the master die comparison method and the CAD data is taken as the golden template in the CAD data comparison method.

4-2-2-1 Array Inspection (Cell Inspection)

An operation of respective algorithm will now be described.

The array inspection is applied to the inspection on cyclic structures. The DRAM cell is one example thereof.

In the inspection, an image to be inspected is compared with a reference image taken as a master, and a difference between them is extracted as the defect. The reference image and the image to be inspected may be represented in a binarized image or a multivalued image for improving the detection accuracy.

The defect may be defined by the difference, in itself, between the reference image and the image to be inspected, but in an alternative way, a secondary determination may be executed based on differential information, such as a differential volume of the detected difference and/or a total area of pixels containing the difference in order to avoid erroneous detection.

In the array inspection, the comparison between the reference image and the image to be inspected is carried out on the basis of a structural cycle. That is, the comparison may be applied for every one structural cycle while reading out the images that have been taken as a batch of images by the CCD, or otherwise, if the reference image contains n units of a structural cycle, the n units of a structural cycle can be compared at a time.

Figure 24:
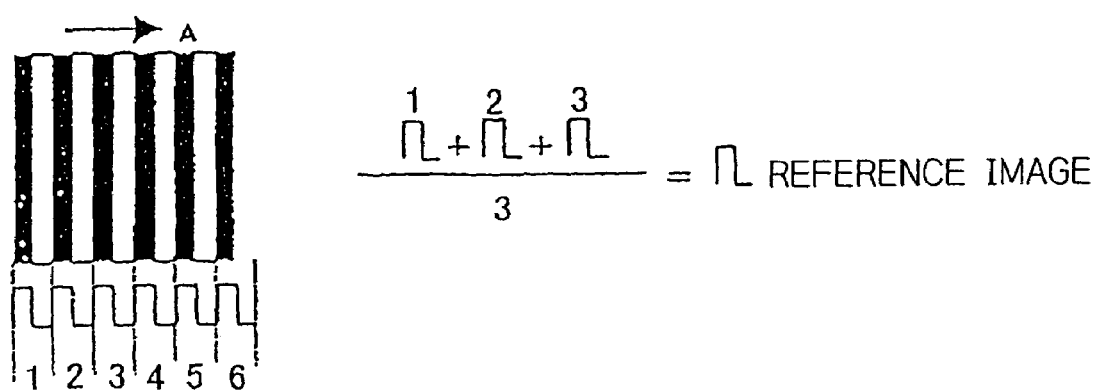
FIG. 24 illustrates how a reference image is produced in the inspection procedure of the semiconductor device manufacturing method according to the present invention.

FIG. 24 shows an exemplary method for generating the reference image. Since an example of a comparison for every one structural cycle is described the generation of one structural cycle is herein presented. The number of cycles may be increased to "n" by the same method.

It is assumed that the inspection in FIG. 24 follows the direction of A. Further, cycle 4 is the cycle to be inspected. The size of the cycles is input by the operator watching the screen, and so cycles 1 to 6 are easily identified in FIG. 24.

Reference cycle image is generated by adding and then averaging the cycles 1 to 3 just before the cycle to be inspected in each pixel. Even if the defect exists in any one of cycles 1 to 3, the averaging operation can reduce the affection from that. Thus generated reference cycle image is compared to the cycle image 4 to be inspected so as to extract the defect.

For the inspection applied to the cycle image 5 to be inspected, cycles 2 to 4 are added and averaged to thus generate the reference cycle image. The reference cyclic image can be generated from the images acquired before the acquisition of the cycle image to be inspected and the inspection continues in this manner.

4-2-2-2 Random Inspection (Die Inspection)

The random inspection is not limited to the die structure but may be applied to any subject. The inspection is executed based on the comparison between a reference image taken as a master and an image to be inspected, and a difference between them is extracted as the defect. The reference image and the image to be inspected may be represented in a binarized image or a multivalued image for improving the detection accuracy. The defect may be defined by the difference, in itself, between the reference image and the image to be inspected, but in an alternative way, a secondary determination may be executed based on differential information, such as a differential volume of the detected difference and/or a total area of pixels containing the difference, in order to avoid the erroneous detection. The random inspection can be classified based on how the reference image is determined. An operation thereof will be described below.

A. Adjacent Die Comparison Method (Die-Die Inspection)

Figure 25:
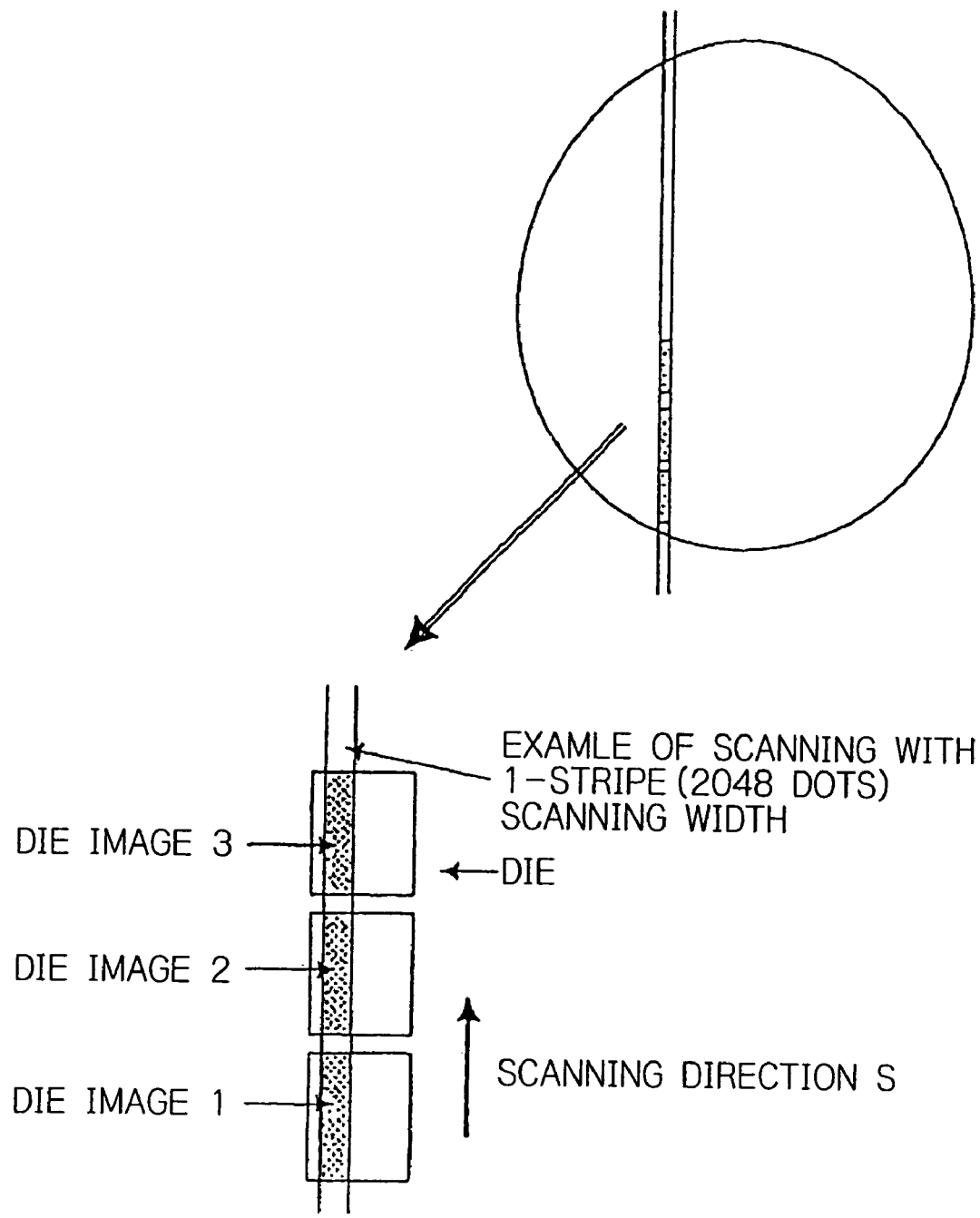
FIG. 25 is a diagram illustrating an adjacent die comparison method in the inspection procedure of the semiconductor device manufacturing method according to the present invention.
Figure 26:
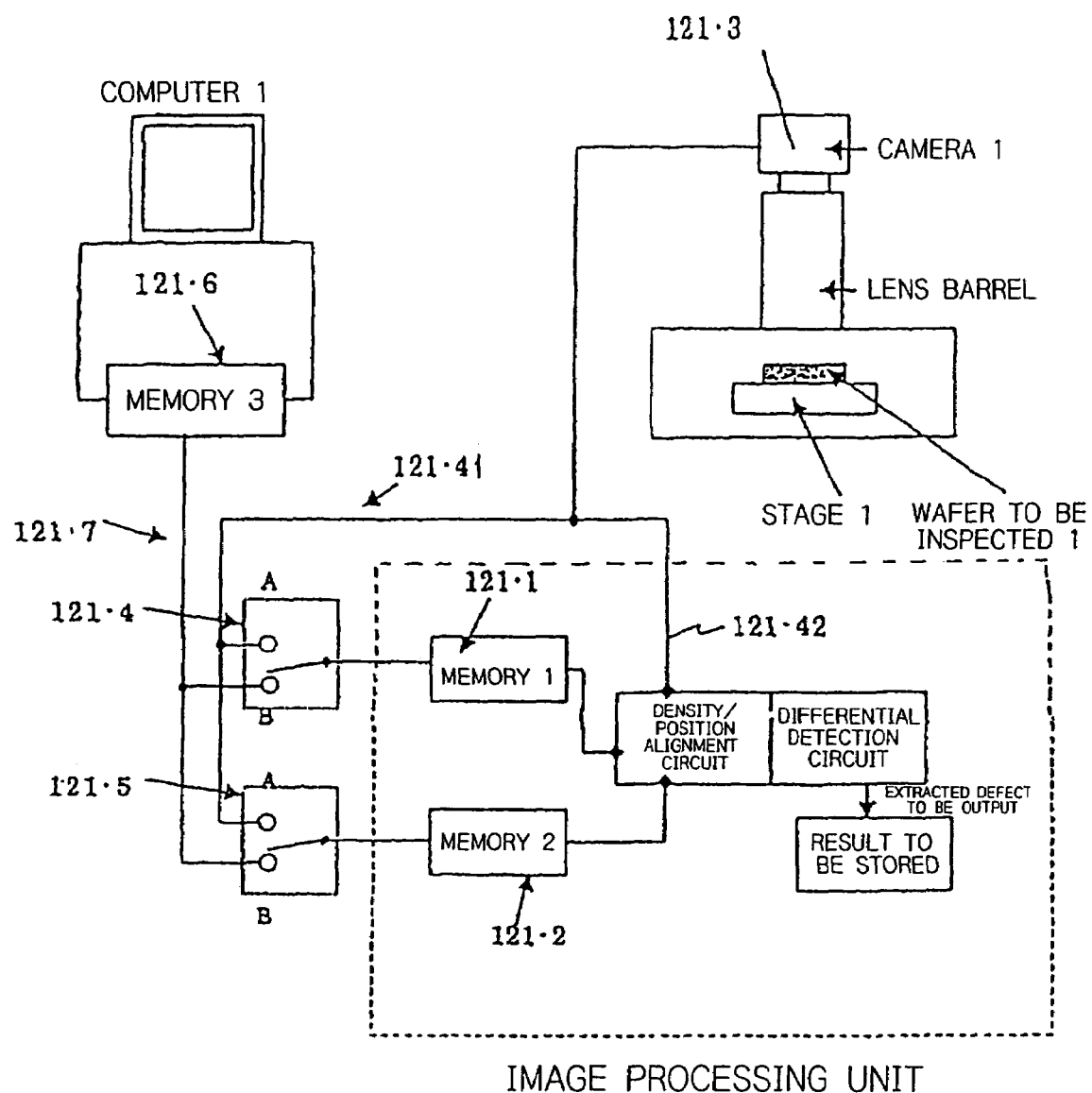
FIG. 26 is another diagram illustrating the adjacent die comparison method in the inspection procedure of the semiconductor device manufacturing method according to the present invention.

The reference image is an image of the die adjacent to the die to be inspected whose image is the image to be inspected. The image to be inspected is compared to the images of two dies adjacent to the die to be inspected so as to determine the defect. That is, as shown in FIGS. 25 and 26, the adjacent die comparison method employs a circuit comprising memories 121·1 and 121·2 of the image processing unit, a path 121·41 from a camera 121·3, and switches 121·4 and 121·5, in which the memories 121·1 and 121·2 are connected to the path 121·41 via the switches 121·4 and 121·5 respectively, and said method comprises the following steps.

a) Step of storing a die image 1 along the scanning direction S through the path 121·41 to the memory 121·1;

b) Step of storing a die image 2 through the path 121·41 to the memory 121·2;

c) Step of, while acquiring the die image 2 through the path 121·42 simultaneously with said step b), comparing thus acquired die image 2 with the image data having stored in the memory 121·1, which represents the image of the same relative position in the die as that of the acquired die image 2, and determining a difference therebetween;

d) Step of storing the difference determined in said step c);

e) Step of storing the die image 3 through the path 121·41 to the memory 121·1;

f) Step of, while acquiring the die image 3 through the path 121·42 simultaneously with said step e), comparing thus acquired die image 3 with the image data having stored in the memory 121·2, which represents the image of the same relative position in the die as that of the acquired die image 3, and determining a difference therebetween;

g) Step of storing the difference determined in said step f);

h) Step of determining the defect in the die image 2 based on the results stored in said steps d) and g); and i) Step of sequentially repeating above steps a) to h) on a series of dies.

Through the setting, before determining the difference in said steps c) and f), the position misalignment between two images to be compared, if any, is corrected so as to delete any positional difference therebetween. Alternatively, the density misalignment between two images, if any, may be corrected so as to delete any difference in density therebetween. Or in other occasions, both of the above corrective operations may be performed.

B. Master Die Comparison Method (Die-Any Die Inspection)

Figure 27:
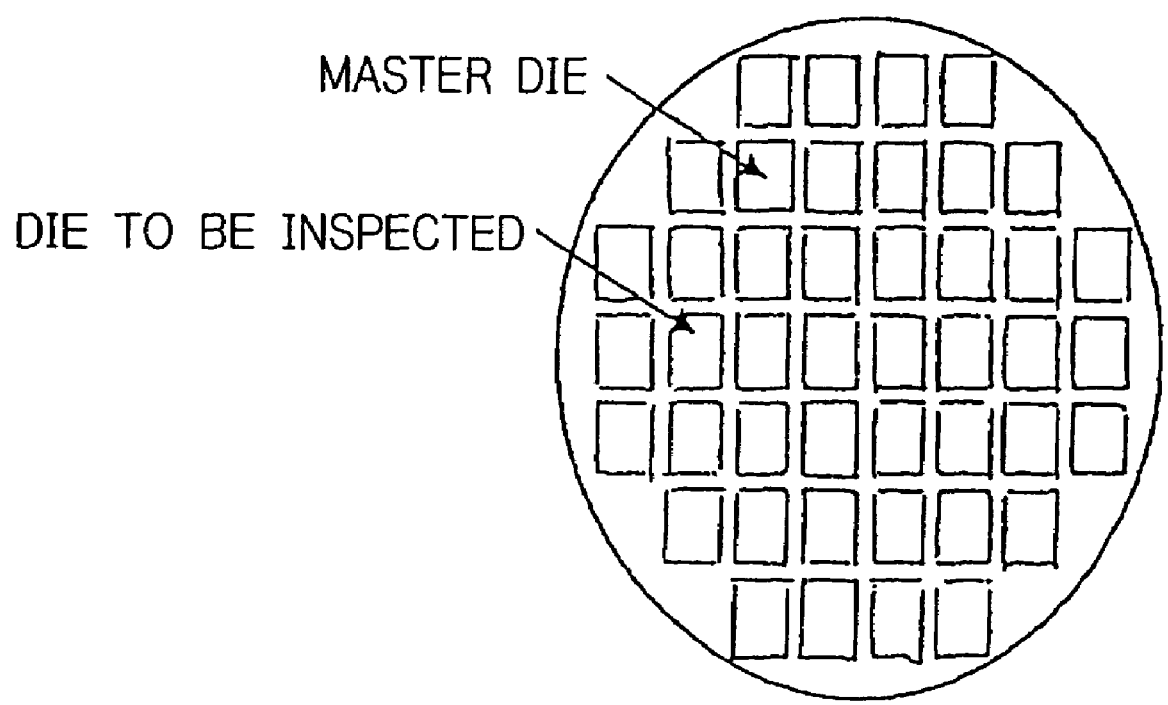
FIG. 27 is a diagram illustrating a master die comparison method in the inspection procedure of the semiconductor device manufacturing method according to the present invention.
Figure 28:
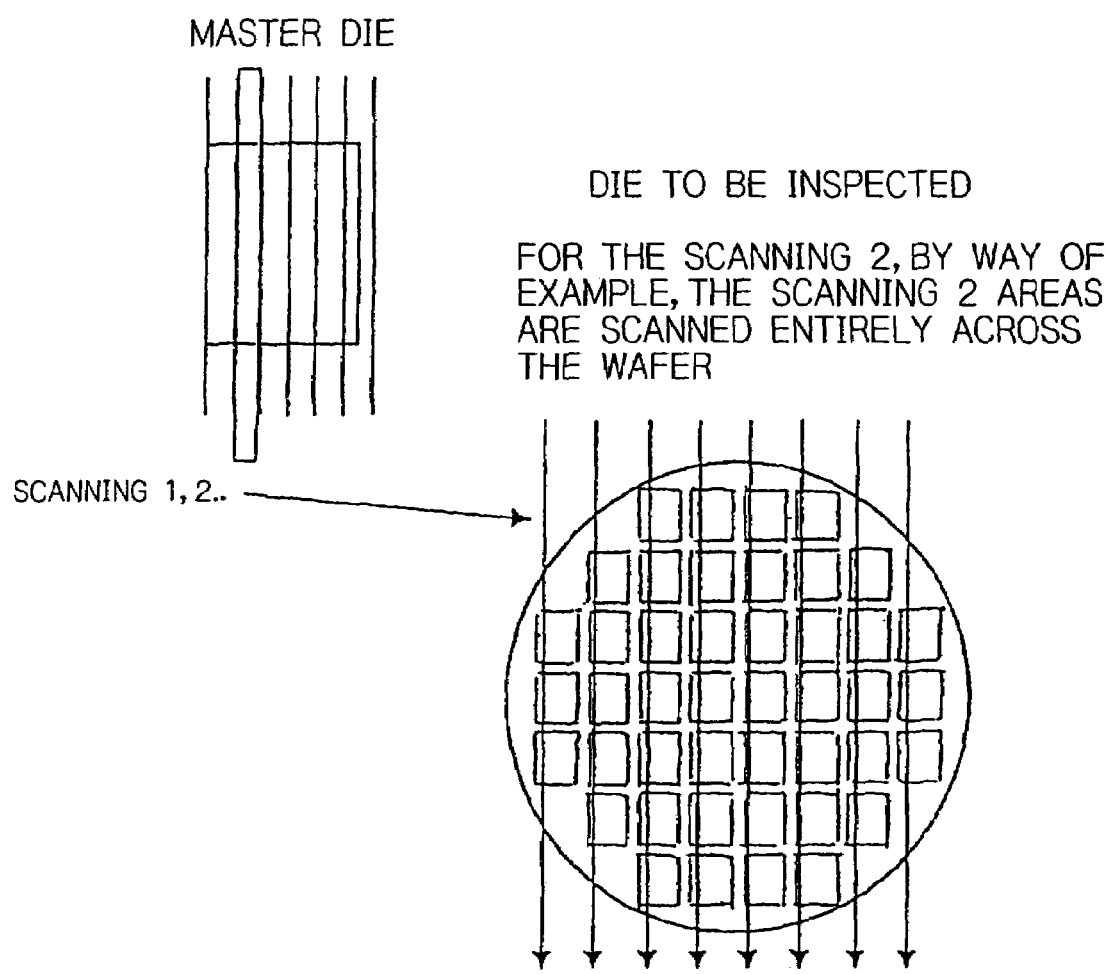
FIG. 28 is another diagram illustrating the master die comparison method in the inspection procedure of the semiconductor device manufacturing method according to the present invention.

A master die is designated by an operator. The master die may be a die existing on the wafer or may be a die image that has been stored before a current inspection, and at first the master die is scanned or the die image is transferred so that the resultant image is stored in the memory and thus designated as the reference image. As shown in FIGS. 26 and 27, the master die comparison method comprises the following steps.

a) Step of, under the control of an operator, selecting a master die from dies on the wafer to be inspected or from the die images that have been stored before the current inspection;

b) Step of, if the master die exists on the wafer to be inspected, setting the switches 121·4 and 121·5 such that at least one of the memories 121·1 or 121·2 of the image processing unit is connected to the path 121·41 from the camera 121·3;

c) Step of, if the master die is the die image stored before the inspection, setting the switches 121·4 and 121·5 such that at least one of the memories 121·1 or 121·2 of the image processing unit is connected to a path 121·7 from a memory 121·6 containing the reference image representing said die image already stored therein;

d) Step of, if the master die exists on the wafer to be inspected, scanning the master die and transferring the resultant reference image representing the master die image to the memory of the image processing unit;

e) Step of, if the master die is the die image stored before the inspection, omitting the scanning and transferring the reference image representing the master die image to the memory of the image processing unit;

f) Step of comparing image data acquired at the same relative position in respective dies with each other, when the image acquired by sequentially scanning the image to be inspected is compared with the image in the memory to which the reference image representing the master die image has been transferred, and determining a difference therebetween;

g) Step of determining the defect based on the difference obtained in said step f); and h) Step of providing a series of inspection on the dies to be inspected in respective identical areas with the scanned position in the master die with respect to the original point in respective dies to be inspected across the entire wafer, as shown in FIG. 28, and repeating said steps d) to g) by changing the scanning position on the master die until the completion of the inspection of the entire die.

Through the setting, before determining the difference in said step f), the position misalignment between two images to be compared, if any, is corrected so as to delete any positional difference therebetween. Alternatively, the density misalignment between two images, if any, may be corrected so as to delete any difference in density therebetween. Or in other occasions, both of the above corrective operations may be performed.

The master die image to be stored in the memory of the image processing unit in said step d) or e) may be an entire image of the master die or may be a part thereof which may be renewed in conjunction with the process of the operation to thus carry out the inspection.

C. CAD Data Comparison Method (Cad Data-Any Die Inspection)

A reference image is created from the CAD data provided as the output from the semiconductor pattern designing process with the CAD in the semiconductor manufacturing process shown in FIG. 28, and thus created reference image is defined as a master image. The master image may be an image of entire die or a part thereof including an area to be inspected.

Further, this CAD data typically has a form of vector data and accordingly cannot be used as the reference image unless it is converted to raster data equivalent to the image data obtained by the scanning operation. In this circumstance, the conversion as defined below is performed in relation to the CAD data processing operation.

a) Converting the vector data representing the CAD data into the raster data.

b) Said conversion in a) is applied by a unit defined by the image scanning width that is obtained during the inspection by scanning the die to be inspected.

c) Said conversion in b) includes the step of converting the image data defined by the same relative position in the die as the image expected to be obtained by the scanning of the die to be inspected.

d) Said conversion in c) includes the inspective scanning and the converting operation, which are executed in an overlapped manner.

Said a) to d) represent an example for converting by the image scanning unit for a higher processing rate, but the unit of the conversion may not necessarily be fixed to the image scanning width and others may be employed to carry out the inspection successfully. Further, a function additional to the converting operation from the vector data to the raster data includes at least one of the following functions.

a) Function to make the raster data multi-valued;

b) Function, in connection with said a), to set a gradation weight and an offset in making multi-valued by taking the sensibility of the inspection apparatus into account; and c) Function to perform an image processing including the processing of pixels, such as expansion and reduction, after the conversion of the vector data to the raster data.

Referring again to FIG. 26, the inspection step in accordance with the CAD data comparison method will be described.

a) Step of converting the CAD data to the raster data in a computer 1, generating a reference image with said additional function and storing said reference image to the memory 121·6;

b) Step of setting the switches 121·4 and 121·5 such that at least one of the memories 121·1 and 121·2 of the image processing unit may be connected to the path 121·7;

c) Step of transferring the reference image in the memory 121·6 to the memory of the image processing unit;

d) Step of comparing image data acquired at the same relative position in respective dies with each other, when the image acquired by sequentially scanning the image to be inspected is compared with the image in the memory to which the reference image, and determining a difference therebetween;

e) Step of determining the defect based on the difference determined in said step d).

f) Step of providing a series of inspections on the dies to be inspected in respective identical areas with the scanned position in the master die, which is taken as the reference image, across the entire wafer, as shown in FIG. 28, and repeating said steps a) to e) by changing the scanning position on the master die until the completion of the inspection of the entire die.

Through the setting, before determining the difference in said step d), the position misalignment between two images to be compared, if any, is corrected so as to delete any positional difference therebetween. Alternatively, the density misalignment between two images, if any, may be corrected so as to delete any difference in density therebetween. Or in other occasions, both of the above corrective operations may be performed.

The master die image to be stored in the memory of the image processing unit in said step c) may be an entire image of the master die or may be a part thereof which may be renewed in conjunction with the process of the operation to thus carry out the inspection.

4-2-2-3 Method for Concurrently Performing the Cell Inspection and the Die Inspection The above explanation has been directed to the respective sets of algorithm used in the array inspection (cell inspection) for inspecting the cyclic structure and in the random inspection, and in an alternative embodiment, the cell inspection and the die inspection can be performed concurrently. Specifically, the cell section and the random section are separately processed, wherein the cell section executes the cell-to-cell comparison within the die, while at the same time the random section executes the comparison to the adjacent die, reference die or CAD data. This can help reduce the inspection time significantly and thus improve the throughput.

It is to be appreciated that in this case, preferably the inspection circuits for the cell section may be provided separately and independently from that of the random section. Further, if the two types of inspections are not executed concurrently, it is also possible to prepare only one circuit adapted to make a switching operation between respective sets of software for the cell inspection and for the random inspection, in which the specific comparative inspection can be performed selectively by switching between different sets of software. That is, if the inspection on the pattern is executed by using a plurality of sets of processing algorithm, those sets of algorithm may be executed by separately prepared respective circuits or may be executed in a single circuit provided with corresponding sets of algorithm by switching between those sets of algorithm. In other words, the present method is applicable to any case where the cell section includes a plurality of types to which the cell-to-cell comparison is applied and further the die-to-die comparison or the die-to-CAD data comparison is applied to the random section.

4-2-2-4 Focus Mapping

Figure 29:
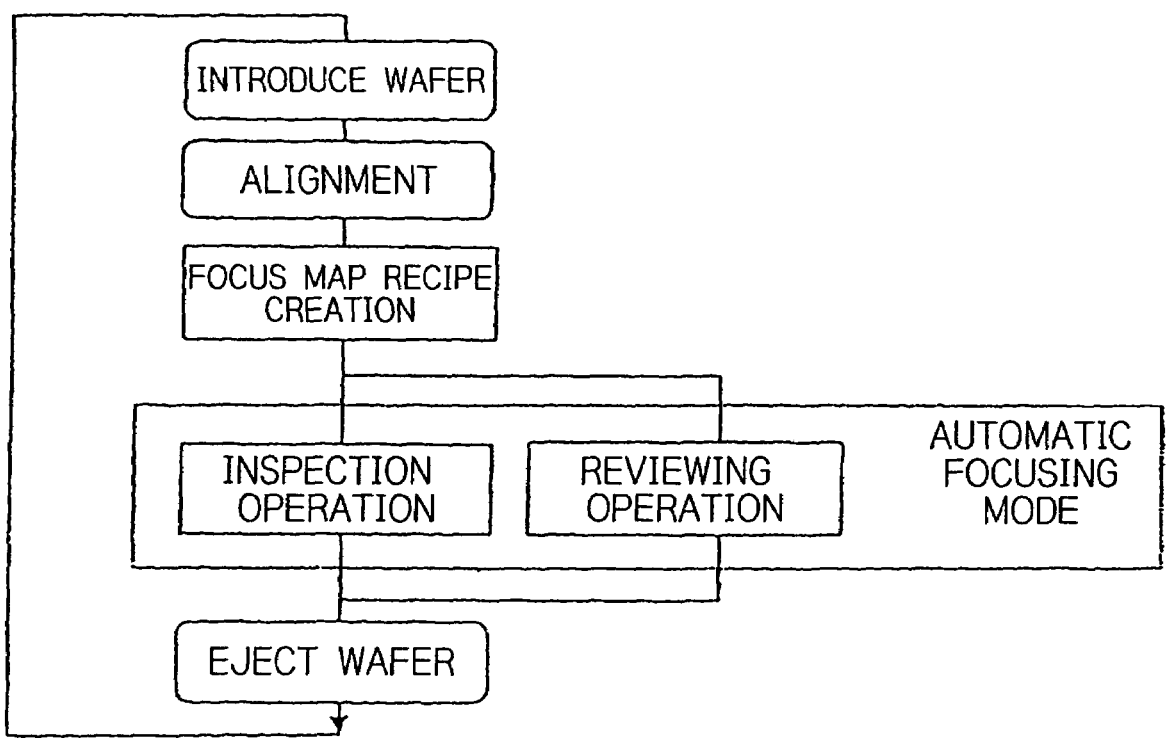
FIG. 29 is a chart illustrating a focus mapping operation in the inspection procedure of the semiconductor device manufacturing method according to the present invention.

A basic flow of focusing function is shown in FIG. 29. After the transfer operation of the wafer, which includes the alignment operation, firstly the recipe containing the designated condition and the like involving the inspection is created. The focus mapping recipe is one of those types of recipes, and in accordance with the focus information specified in this recipe, the automatic focusing function is performed during inspection operation and reviewing operation. A procedure for creating the focus map recipe and an operational procedure of the automatic focusing will now be described.

Procedure for creating the focus map recipe

The focus map recipe has an independent input screen in the illustrated example, in which the operator executes the following steps to create the recipe, but this input screen may be added to the other input screen provided for a different purpose.

a) Step of inputting focus map coordinates, such as die position and a pattern within the die, on which the focusing value is input. Switch 126·1 in FIG. 30.

b) Step of setting a die pattern that will be required for an automatic measurement of the focusing value. This step may be skipped, if no automatic measurement of the focusing value is required.

c) Step of setting a best focusing value for the focus map coordinates determined in said step a).

Although, in the step a), the operator can designate a desired die, such a setting for selecting all dies or for selecting every n-th die is also feasible. Further, on the input screen, the operator may select either of a diagram showing schematically the die arrays within the wafer and the image using an actual image.

Figure 30:
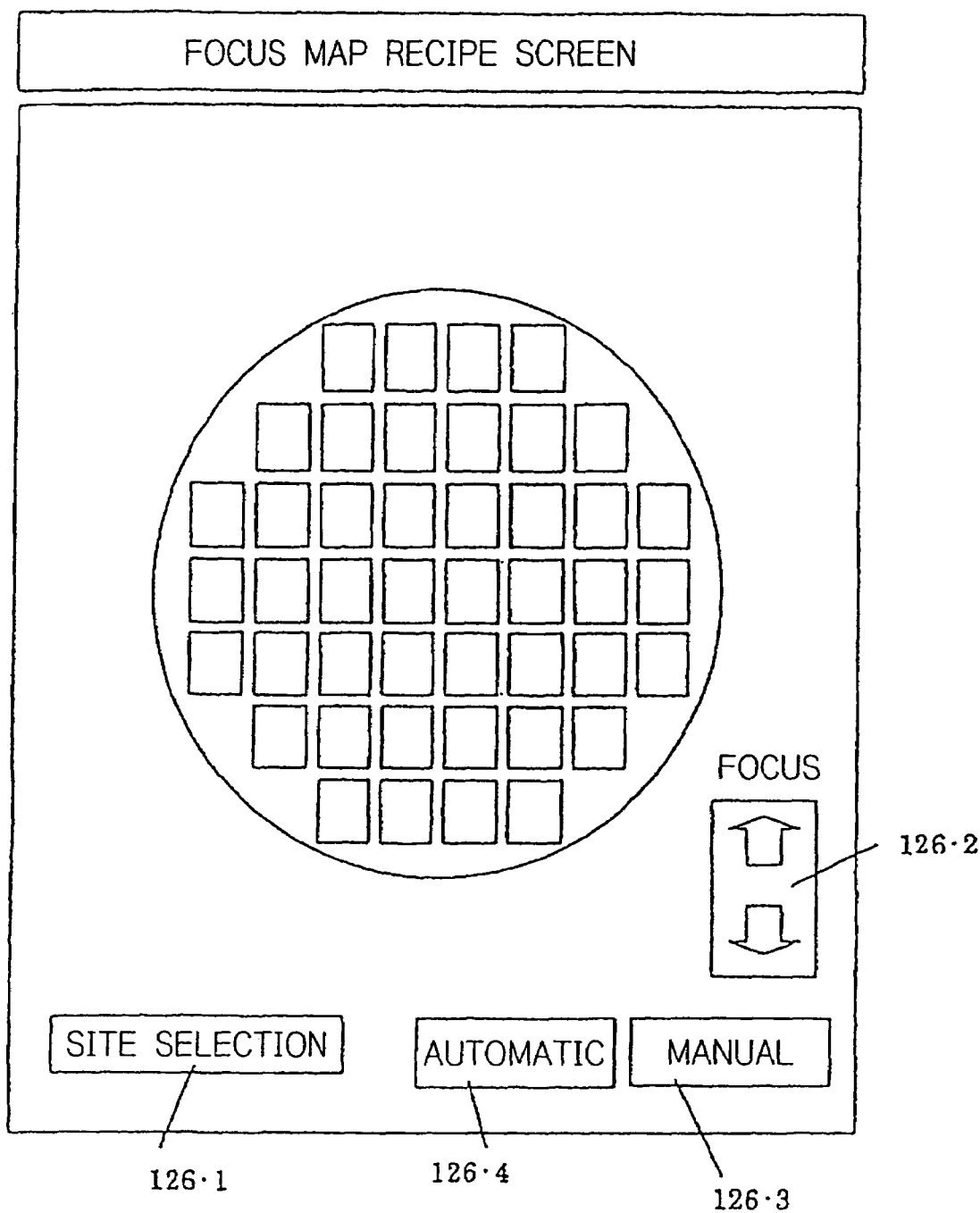
FIG. 30 is a diagram illustrating the focus mapping operation in the inspection procedure of the semiconductor device manufacturing method according to the present invention.

In this procedure, said step c) executes the selection and setting operation in a mode where the operator manually sets the focusing value by the focusing switch 126·2 which is linked with a voltage value of the focusing electrode (switch 126·3 of FIG. 30) or in another mode where the focusing value is automatically determined (switch 126·4 of FIG. 30).

Procedure for automatic measurement of the focusing value

Figure 31:
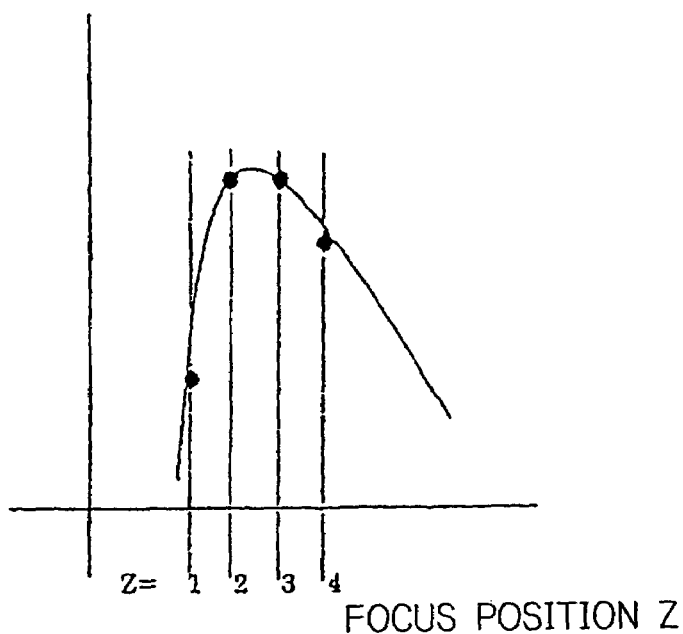
FIG. 31 is a graphical representation illustrating the focus mapping operation in the inspection procedure of the semiconductor device manufacturing method according to the present invention.

The procedure for determining the focusing value automatically in said step c) includes the following steps by way of example in FIG. 31:

a) Step of determining the image for the focal position, Z=1, and calculating its contrast;

b) Step of applying said step a) to Z=2, 3 and 4;

c) Step of executing recursion from the contrast value obtained in said steps a) and b) to determine a contrast function (FIG. 31); and d) Step of determining the Z that can produce the maximum value in the contrast function through, the arithmetic operation, and taking the determined value as the best focusing value.

Figure 32:
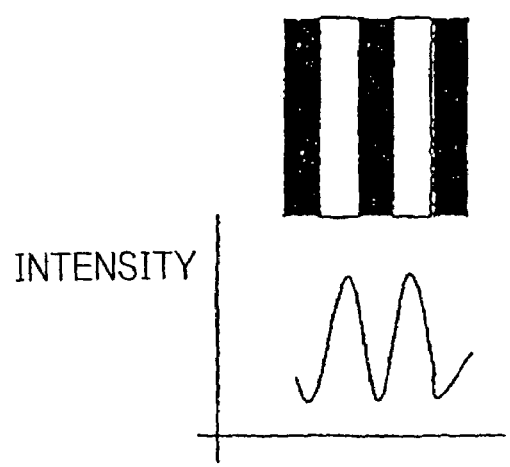
FIG. 32 is another graphical representation illustrating the focus mapping operation in the inspection procedure of the semiconductor device manufacturing method according to the present invention.

For example, the die pattern required in the automatic measurement of the focusing value may yield a good result when such a line and space as shown in FIG. 32 is selected, whereas the measurement of the contrast can be carried out simply with a black and white pattern regardless of the geometry.

Executing the steps as defined in said steps a) to d) can determine the best focusing value for one specified point. The data format in this stage is represented by a set of values (X, Y, Z), where X, Y: coordinate values on which the best focusing value has been determined, Z: the best focusing value, and contains the focus map coordinate number (X, Y, Z) determined in the focus map recipe. This is referred to as a focus map file, constituting a part of the focus map recipe.

Operational procedure of the automatic focusing The inspection operation for obtaining the image from the focus map recipe, and the method for setting the focus at the best focusing value during the reviewing operation may be carried out in the following steps:

a) Step of segmentalizing the position information based on the focus map file 1 created by the creation of the focus map recipe and calculating the best focusing for thus segmentalized parts to thereby create the segmentalized focus map file 2;

b) Said calculation in said step a) is executed by using the interpolation function;

c) Said interpolation function in said step b) is designated by the operator in the creation of the focus map recipe, using the linear interpolation or the spline interpolation, for example; and d) Step of monitoring the XY position of the stage unit and changing the voltage applied to the focusing electrode to the focusing value suitable for the current XY position, as designated in the focus map file 2.

Figure 33:
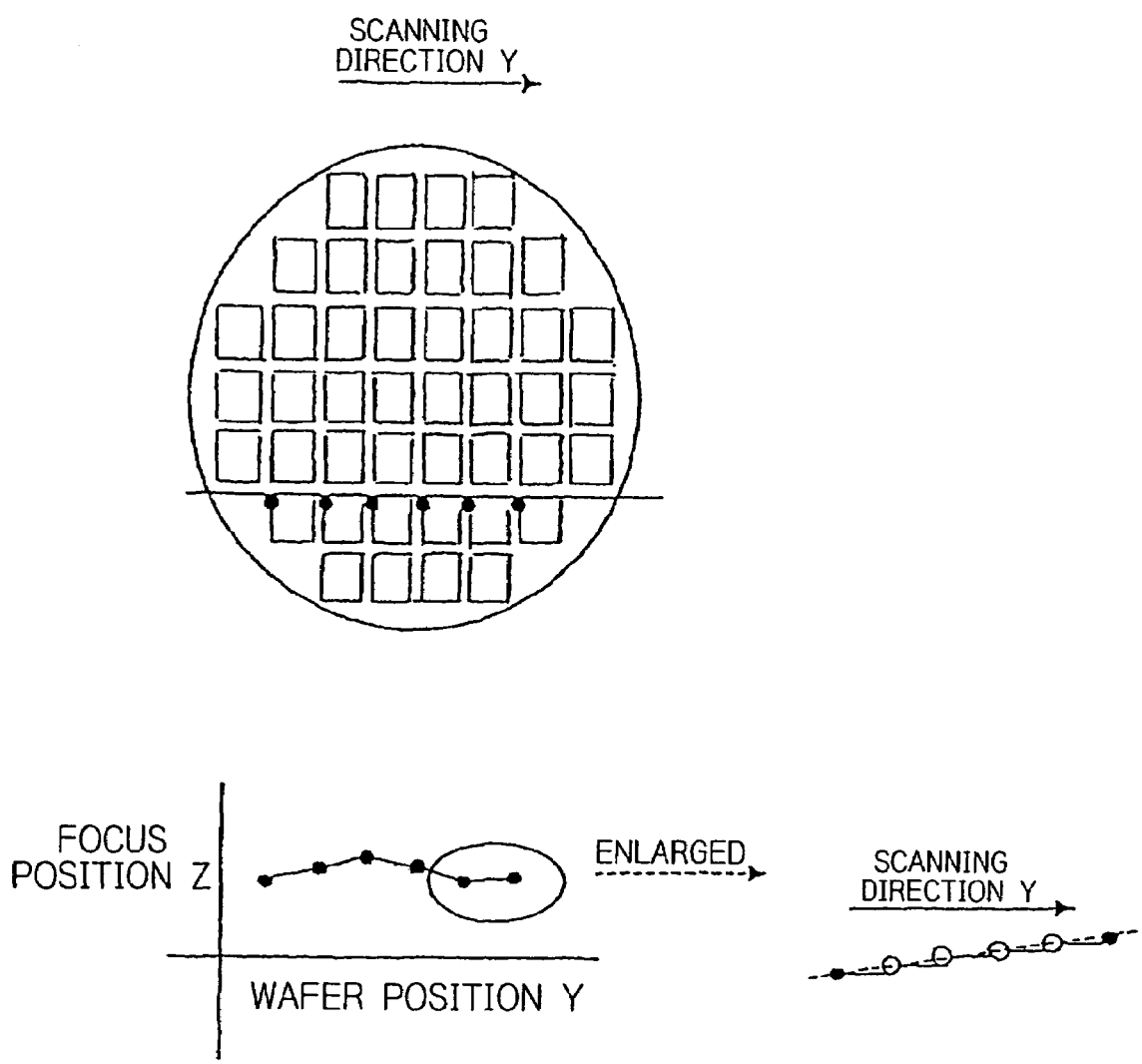
FIG. 33 is another diagram illustrating the focus mapping operation in the inspection procedure of the semiconductor device manufacturing method according to the present invention.

To explain more specifically, in FIG. 33, a black dot indicates a focusing value in the focus map file 1 and a white dot indicates a focusing value in the focus map file 2, wherein, (1) a space between the focusing values in the focus map file 1 is interpolated with the focusing values in the focus map file 2; and (2) the focus position, Z, is varied in conjunction with the scanning operation so as to maintain the currently best focusing value. At this time, in the space between the values in the focus map file 2 (between the white dots), the focusing value remains unchanged until the next position where the focusing value should be changed favorably.

5. Embodiment of Manufacturing Line

Figure 34:
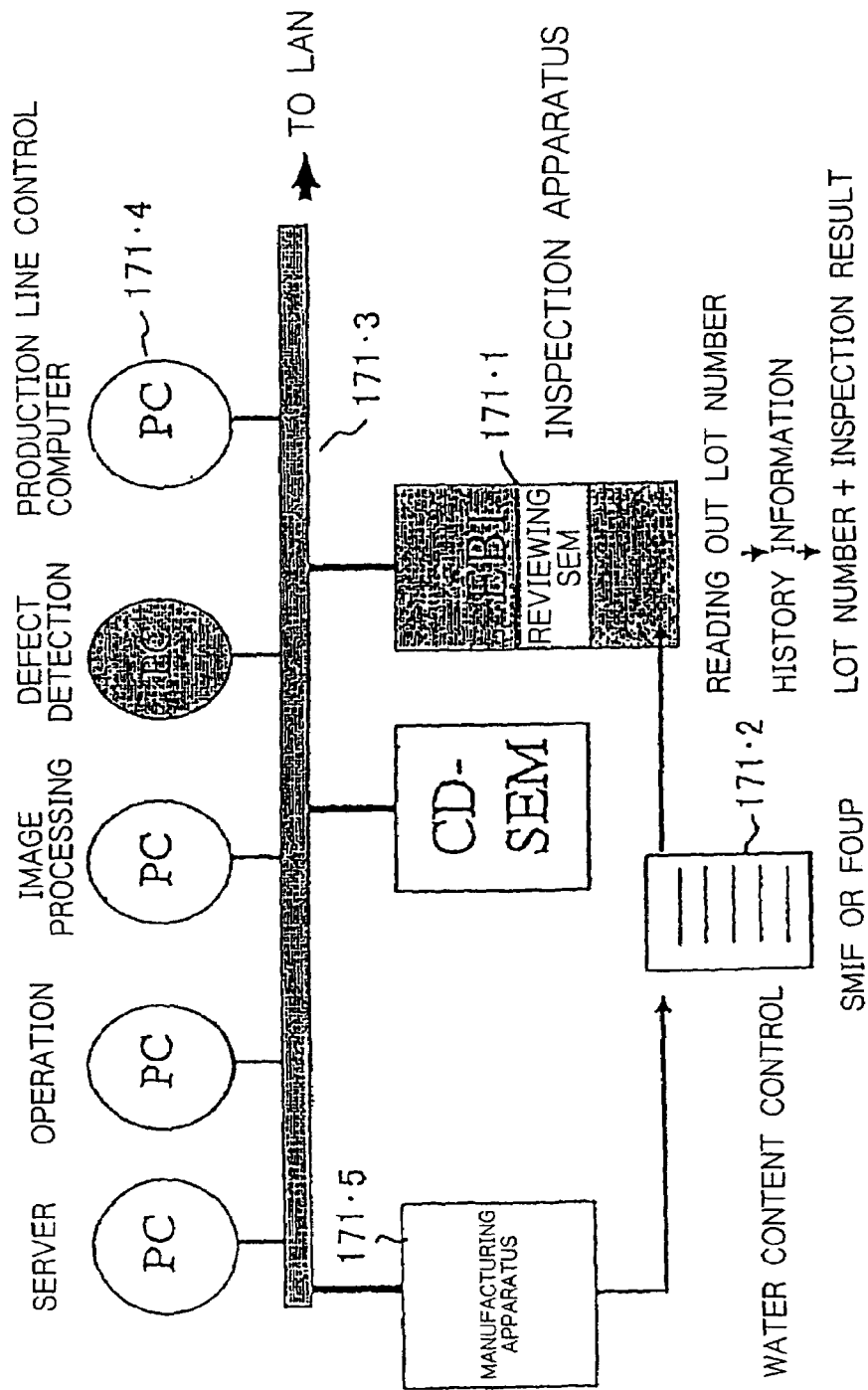
FIG. 34 is a diagram showing an embodiment of an application of the inspection apparatus according to the present invention connected to a manufacturing line.

FIG. 34 shows an example of a manufacturing line using an apparatus of the present invention. In this arrangement, such information including a lot number of a wafer to be inspected in an inspection apparatus 171·1 and a history of a manufacturing apparatus used in the production process may be read out from a memory disposed in a SMIF or FOUP 171·2, or the lot number may be identified by reading the ID number associated with the involving SMIF, FOUP or wafer cassette. During the transport of the wafer, an amount of wafer content is controlled so as to prevent the oxidization or the like of metallic wirings.

An inspection apparatus 171·1 is adapted to be connected with a network system 171·3 of the production line, through which network system 171·3, the information such as the lot number of the wafer, which is the subject to be inspected, and the inspection result can be sent to a production line controlling computer 171·4 for controlling the production line, respective manufacturing apparatuses 171·5 and other inspection apparatuses. The manufacturing apparatus may include the lithography related equipment including, for example, an exposing unit, a coater, a curing unit, a developer, or the film deposition equipment such as an etching unit, a sputtering unit and a CVD unit, the CMP apparatus, a variety of measuring devices and other inspection apparatuses.

6. Embodiment Using Other Types of Electrons

In the inspection of the sample, it is preferred from the viewpoint of resolution to acquire an image of a substrate surface by driving an electron beam to impinge upon a substrate and then detecting electrons emanating from the substrate. Accordingly, in the above-described embodiments, the explanation has been directed primary to the examples using the secondary electrons, reflected electrons or back-scattering electrons emanating from the substrate. However, the electrons to be detected may be any types of electron so far as it contains the information on the surface of the substrate including, for example, miller electrons (generally referred to as reflected electrons) that are reflected in the vicinity of the substrate with the aid of the inverse electric field produced in proximity to the substrate without direct impingement upon the substrate and transmission electrons that are transmitted through the substrate. Especially in use of miller electrons, advantageously the effect of charge-up can be reduced to an extremely low level owing to the fact that the electrons do not impinge directly upon the sample.

In use of the miller electrons, the sample is applied with a negative potential lower than the accelerating voltage so as to form the inverse electric field in the vicinity of the sample. This negative potential may be set to such a value that can drive the majority of electrons in the vicinity of the surface of the substrate to return back. Specifically, the potential may be set to a value lower than the accelerating voltage of the electron gun by at least 0.5 to 1.0 V. For example, in the illustrated embodiment, for the accelerating voltage of −4 kV, preferably the voltage applied to the sample may be set in a range of −4.000 kV to −4.050 kV. More preferably, it may be set in a range of −4.0005 kV to −4.020 kV, most preferably in a range of −4.0005 kV to −4.010 kV.

Further, in use of the transmission electrons, for the set accelerating voltage of −4 kV, the voltage applied to the sample may be preferably in a range of 0 to −4 kV, more preferably in a range of 0 to −3.9 kV and most preferably in a range of 0 to −3.5 kV.

In addition, the light ray and the X-ray may be employed, as well, although they are not the electron rays. The alignment, the secondary system and/or the die comparison of the present embodiments can be applied sufficiently to these rays without any problem.

INDUSTRIAL APPLICABILITY

In accordance with the sample observing method according to the present invention, the full surface inspection across a sample surface, the extraction of a defective region in the sample and the magnification or the detailed observation of the extracted defective region can be performed by a single electron beam apparatus concurrently in real time. Therefore, the present invention has such an advantageous industrial applicability that the cost required for purchasing separate equipment for the detailed observation, the wafer transfer time and the mounting time for mounting the wafer on said separate equipment can be reduced significantly and thus the throughput in the defect inspection can be improved.

The foregoing disclosure is the best mode devised by the inventor for practicing this invention. It is apparent, however, that apparatus incorporating modifications and variations will be obvious to one skilled in the art of an electron beam apparatus. Inasmuch as the foregoing disclosure is intended to enable one skilled in the pertinent art to practice the instant invention, it should not be construed to be limited thereby but should be construed to include such aforementioned obvious variations and be limited only by the spirit and scope of the following claims.

The entire disclosure of Japanese Patent Application No. 2003-429926 filed on Dec. 25, 2003 including specification, claims, drawings and summary is incorporated herein by reference in its entirety.

What is claimed is:

1. A sample observing method for performing observation of a sample surface by an electron beam apparatus, comprising the steps of:

irradiating an electron beam formed in a first shape in section view to a sample surface and detecting miller electrons reflected in the vicinity of the sample surface to thereby provide inspection of said sample surface;

extracting a defective region in the sample based on the inspection; and irradiating the electron beam formed in a second shape in section view to said extracted defective region to thereby provide magnification or detailed observation of said defective region, wherein an illumination area of said second shape is smaller than an illumination area of said first shape.

2. A sample observing method according to claim 1, in which said electron beam apparatus has an optical system of image projection type and capable of performing both of said inspection of the sample surface and said detailed observation.

3. A sample observing method according to claim 2, in which an optical system of image projection type is used in said inspection of the sample surface and an optical system of scanning electron microscope type having a detector for detecting said miller electrons, which is positioned in the vicinity of the sample is used in said detailed observation.

4. A sample observing method according to claim 2, in which a line sensor is arranged in an optical system of said electron beam apparatus for performing said inspection of the sample surface, wherein said inspection of the sample surface and said detailed observation are simultaneously performed, while the sample or wafer stage is continuously moving.

5. A sample observing method of claim 1, further comprises irradiating charged particles to the sample surface by pre-charge unit before said irradiating the electron beam formed in said first shape to the sample surface.

6. A sample observing method according to claim 5, wherein the sample is applied with a negative potential lower than an accelerating voltage of an electron gun so as to form the inverse electric field in the vicinity of the sample.

7. A sample observing method according to claim 6, wherein the negative potential applied to the sample is lower than the accelerating voltage by at least 0.5 to 1.0V.

* * * * *